United States Patent
Tousignant et al.

(10) Patent No.: US 10,353,411 B2
(45) Date of Patent: *Jul. 16, 2019

(54) BYPASS SWITCH FOR IN-LINE POWER STEAL

(71) Applicant: Ademco Inc., Golden Valley, MN (US)

(72) Inventors: Daniel Tousignant, St-Jean-sur-Richelieu (CA); Martin Plouffe, Saint-Ignace-de-Stanbridge (CA)

(73) Assignee: Ademco Inc., Golden Valley, MN (US)

( * ) Notice: Subject to any disclaimer, the term of this patent is extended or adjusted under 35 U.S.C. 154(b) by 178 days.

This patent is subject to a terminal disclaimer.

(21) Appl. No.: 15/432,531

(22) Filed: Feb. 14, 2017

(65) Prior Publication Data

US 2017/0153655 A1 Jun. 1, 2017

Related U.S. Application Data

(63) Continuation of application No. 14/309,553, filed on Jun. 19, 2014, now Pat. No. 9,628,074.

(51) Int. Cl.
  *H02M 1/44* (2007.01)
  *G05D 23/19* (2006.01)
  (Continued)

(52) U.S. Cl.
  CPC ............. *G05D 23/19* (2013.01); *G05F 1/625* (2013.01); *H02M 1/12* (2013.01); *H02M 1/44* (2013.01);
  (Continued)

(58) Field of Classification Search
  None
  See application file for complete search history.

(56) References Cited

U.S. PATENT DOCUMENTS

| 3,464,673 A | 9/1969 | Cargo et al. |
| 3,665,159 A | 5/1972 | Becker et al. |

(Continued)

FOREIGN PATENT DOCUMENTS

| CA | 1035448 A | 7/1978 |
| DE | 3334117 A1 | 4/1985 |

(Continued)

OTHER PUBLICATIONS

Climatouch, User Manual, Climatouch CT03TSB Thermostat, Climatouch CT03TSHB Thermostat with Humidity Control, Outdoor UHF Temperature Transmitter 217S31, 19 pages, Printed Sep. 15, 2004.

(Continued)

*Primary Examiner* — Jared Fureman
*Assistant Examiner* — James P Evans
(74) *Attorney, Agent, or Firm* — Shumaker & Sieffert, P.A.

(57) ABSTRACT

A power supply unit for use with thermostats or other like devices. The power supply unit may keep electromagnetic interference emissions and harmonics at a minimum. A unit may have enough power for triggering a switch at about a cross over point of a waveform of input power to the unit. Power for triggering may come from a storage source. Power for the storage source may be provided with power stealing which require switching transistors which can generate emissions. In-line thermostats using MOSFETS power steal may do the power steal during an ON state (triac, relay or silicon controlled rectifier activated). Gate signals to the transistors may be especially shaped to keep emissions from transistor switching at a minimum. All that may be needed, during an OFF state as a bypass, is a high voltage controllable switch. The need may be achieved using high voltage MOSFETS.

21 Claims, 16 Drawing Sheets

(51) Int. Cl.

| | |
|---|---|
| *H02M 5/257* | (2006.01) |
| *H02M 7/217* | (2006.01) |
| *H03K 17/081* | (2006.01) |
| *H03K 17/687* | (2006.01) |
| *H03K 17/60* | (2006.01) |
| *G05F 1/625* | (2006.01) |
| *H02M 1/12* | (2006.01) |

(52) U.S. Cl.
CPC ...... *H02M 7/217* (2013.01); *H03K 17/08104* (2013.01); *H03K 17/60* (2013.01); *H03K 17/687* (2013.01); *H02M 5/2573* (2013.01); *H03K 2217/0081* (2013.01)

(56) References Cited

U.S. PATENT DOCUMENTS

| | | |
|---|---|---|
| 3,899,713 A | 8/1975 | Barkan et al. |
| 3,942,028 A | 3/1976 | Baker |
| 4,078,720 A | 3/1978 | Nurnberg |
| 4,079,366 A | 3/1978 | Wong |
| 4,093,943 A | 6/1978 | Knight |
| 4,151,387 A | 4/1979 | Peters, Jr. |
| 4,174,807 A | 11/1979 | Smith et al. |
| 4,197,571 A | 4/1980 | Grunert |
| 4,224,615 A | 9/1980 | Penz |
| 4,232,819 A * | 11/1980 | Bost ................. G05D 23/1902 236/47 |
| 4,257,555 A | 3/1981 | Neel |
| 4,264,034 A | 4/1981 | Hyltin et al. |
| 4,274,045 A | 6/1981 | Goldstein |
| 4,296,334 A | 10/1981 | Wong |
| 4,298,946 A | 11/1981 | Hartsell et al. |
| 4,300,199 A | 11/1981 | Yoknis et al. |
| 4,308,991 A | 1/1982 | Peinetti et al. |
| 4,316,256 A | 2/1982 | Hendricks et al. |
| 4,332,352 A | 6/1982 | Jaeger |
| 4,337,822 A | 7/1982 | Hyltin et al. |
| 4,337,893 A | 7/1982 | Flanders et al. |
| 4,373,664 A | 2/1983 | Barker et al. |
| 4,379,483 A | 4/1983 | Farley |
| 4,382,544 A | 5/1983 | Stewart |
| 4,384,213 A | 5/1983 | Bogel |
| 4,386,649 A | 6/1983 | Hines et al. |
| 4,388,692 A | 6/1983 | Jones et al. |
| 4,431,134 A | 2/1984 | Hendricks et al. |
| 4,446,913 A | 5/1984 | Krocker |
| 4,479,604 A | 10/1984 | Didner |
| 4,503,471 A | 3/1985 | Hanajima et al. |
| 4,504,778 A | 3/1985 | Evans |
| 4,506,827 A | 3/1985 | Jamieson et al. |
| 4,556,169 A | 12/1985 | Zervos |
| 4,585,164 A | 4/1986 | Butkovich et al. |
| 4,606,401 A | 8/1986 | Levine et al. |
| 4,621,336 A | 11/1986 | Brown |
| 4,622,544 A | 11/1986 | Bially et al. |
| 4,628,201 A | 12/1986 | Schmitt |
| 4,641,013 A | 2/1987 | Dunnigan et al. |
| 4,646,964 A | 3/1987 | Parker et al. |
| 4,692,596 A | 9/1987 | Payne |
| 4,706,177 A | 11/1987 | Josephson |
| 4,717,333 A | 1/1988 | Carignan |
| 4,725,001 A | 2/1988 | Carney et al. |
| 4,745,300 A | 5/1988 | Kammerer et al. |
| 4,745,311 A | 5/1988 | Iwasaki |
| 4,806,843 A | 2/1989 | Mertens et al. |
| 4,811,183 A | 3/1989 | Fletcher |
| 4,829,779 A | 5/1989 | Munson et al. |
| 4,837,731 A | 6/1989 | Levine et al. |
| 4,881,686 A | 11/1989 | Mehta |
| 4,918,439 A | 4/1990 | Wozniak et al. |
| 4,939,995 A | 7/1990 | Feinberg |
| 4,942,613 A | 7/1990 | Lynch |
| 4,948,040 A | 8/1990 | Kobayashi et al. |
| 4,969,508 A | 11/1990 | Tate et al. |
| 4,992,779 A | 2/1991 | Sugino et al. |
| 4,997,029 A | 3/1991 | Otsuka et al. |
| 5,005,365 A | 4/1991 | Lynch |
| 5,012,973 A | 5/1991 | Dick et al. |
| 5,025,134 A | 6/1991 | Bensoussan et al. |
| 5,036,698 A | 8/1991 | Conti |
| 5,038,851 A | 8/1991 | Mehta |
| 5,053,752 A | 10/1991 | Epstein et al. |
| 5,065,813 A | 11/1991 | Berkeley et al. |
| 5,081,411 A | 1/1992 | Walker |
| 5,086,385 A | 2/1992 | Launey et al. |
| 5,088,645 A | 2/1992 | Bell |
| 5,118,963 A | 6/1992 | Gesin |
| 5,120,983 A | 6/1992 | Samann |
| 5,140,310 A | 8/1992 | DeLuca et al. |
| 5,161,606 A | 11/1992 | Berkeley et al. |
| 5,170,935 A | 12/1992 | Federspiel et al. |
| 5,172,565 A | 12/1992 | Wruck et al. |
| 5,181,653 A | 1/1993 | Foster et al. |
| 5,187,797 A | 2/1993 | Nielsen et al. |
| 5,192,874 A | 3/1993 | Adams |
| 5,210,685 A | 5/1993 | Rosa |
| 5,221,877 A | 6/1993 | Falk |
| 5,226,591 A | 7/1993 | Ratz |
| 5,230,482 A | 7/1993 | Ratz et al. |
| 5,238,184 A | 8/1993 | Adams |
| 5,251,813 A | 10/1993 | Kniepkamp |
| 5,259,445 A | 11/1993 | Pratt et al. |
| 5,272,477 A | 12/1993 | Tashima et al. |
| 5,277,244 A | 1/1994 | Mehta |
| 5,289,047 A | 2/1994 | Broghammer |
| 5,294,849 A | 3/1994 | Potter |
| 5,317,670 A | 5/1994 | Elia |
| 5,329,991 A | 7/1994 | Mehta et al. |
| 5,348,078 A | 9/1994 | Dushane et al. |
| 5,351,035 A | 9/1994 | Chrisco |
| 5,361,009 A | 11/1994 | Lu |
| 5,386,577 A | 1/1995 | Zenda |
| 5,390,206 A | 2/1995 | Rein et al. |
| 5,404,934 A | 4/1995 | Carlson et al. |
| 5,414,618 A | 5/1995 | Mock et al. |
| 5,429,649 A | 7/1995 | Robin |
| 5,439,441 A | 8/1995 | Grimsley et al. |
| 5,452,197 A | 9/1995 | Rice |
| 5,482,209 A | 1/1996 | Cochran et al. |
| 5,495,887 A | 3/1996 | Kathnelson et al. |
| 5,502,618 A | 3/1996 | Chiou |
| 5,506,572 A | 4/1996 | Hills et al. |
| 5,526,422 A | 6/1996 | Keen |
| 5,537,106 A | 7/1996 | Mitsuhashi |
| 5,544,036 A | 8/1996 | Brown, Jr. et al. |
| 5,566,879 A | 10/1996 | Longtin |
| 5,570,837 A | 11/1996 | Brown et al. |
| 5,579,197 A | 11/1996 | Mengelt et al. |
| 5,590,831 A | 1/1997 | Manson et al. |
| 5,603,451 A | 2/1997 | Helander et al. |
| 5,654,813 A | 8/1997 | Whitworth |
| 5,668,535 A | 9/1997 | Hendrix et al. |
| 5,671,083 A | 9/1997 | Connor et al. |
| 5,673,850 A | 10/1997 | Uptegraph |
| 5,679,137 A | 10/1997 | Erdman et al. |
| 5,682,206 A | 10/1997 | Wehmeyer et al. |
| 5,711,785 A | 1/1998 | Maxwell |
| 5,732,691 A | 3/1998 | Maiello et al. |
| 5,736,795 A | 4/1998 | Zuehlke et al. |
| 5,761,083 A | 6/1998 | Brown, Jr. et al. |
| 5,782,296 A | 7/1998 | Mehta |
| 5,801,940 A | 9/1998 | Russ et al. |
| 5,810,908 A | 9/1998 | Gray et al. |
| 5,818,428 A | 10/1998 | Eisenbrandt et al. |
| 5,833,134 A | 11/1998 | Ho et al. |
| 5,839,654 A | 11/1998 | Weber |
| 5,840,094 A | 11/1998 | Osendorf et al. |
| 5,862,737 A | 1/1999 | Chin et al. |
| 5,873,519 A | 2/1999 | Beilfuss |
| 5,886,697 A | 3/1999 | Naughton et al. |
| 5,899,866 A | 5/1999 | Cyrus et al. |
| 5,902,183 A | 5/1999 | D'Souza |
| 5,903,139 A | 5/1999 | Kompelien |

(56) References Cited

U.S. PATENT DOCUMENTS

| | | |
|---|---|---|
| 5,909,429 A | 6/1999 | Satyanarayana et al. |
| 5,915,473 A | 6/1999 | Ganesh et al. |
| 5,917,141 A | 6/1999 | Naquin, Jr. |
| 5,917,416 A | 6/1999 | Read |
| D413,328 S | 8/1999 | Kazama |
| 5,937,942 A | 8/1999 | Bias et al. |
| 5,947,372 A | 9/1999 | Tiernan |
| 5,950,709 A | 9/1999 | Krueger et al. |
| 6,009,355 A | 12/1999 | Obradovich et al. |
| 6,013,121 A | 1/2000 | Chin et al. |
| 6,018,700 A | 1/2000 | Edel |
| 6,020,881 A | 2/2000 | Naughton et al. |
| 6,032,867 A | 3/2000 | Dushane et al. |
| D422,594 S | 4/2000 | Henderson et al. |
| 6,059,195 A | 5/2000 | Adams et al. |
| 6,081,197 A | 6/2000 | Garrick et al. |
| 6,084,523 A | 7/2000 | Gelnovatch et al. |
| 6,089,221 A | 7/2000 | Mano et al. |
| 6,101,824 A | 8/2000 | Meyer et al. |
| 6,104,963 A | 8/2000 | Cebasek et al. |
| 6,119,125 A | 9/2000 | Gloudeman et al. |
| 6,121,875 A | 9/2000 | Hamm et al. |
| 6,140,987 A | 10/2000 | Stein et al. |
| 6,141,595 A | 10/2000 | Gloudeman et al. |
| 6,145,751 A | 11/2000 | Ahmed |
| 6,149,065 A | 11/2000 | White et al. |
| 6,152,375 A | 11/2000 | Robison |
| 6,154,081 A | 11/2000 | Pakkala et al. |
| 6,167,316 A | 12/2000 | Gloudeman et al. |
| 6,190,442 B1 | 2/2001 | Redner |
| 6,192,282 B1 | 2/2001 | Smith et al. |
| 6,196,467 B1 | 3/2001 | Dushane et al. |
| 6,205,041 B1 | 3/2001 | Baker |
| 6,208,331 B1 | 3/2001 | Singh et al. |
| 6,216,956 B1 | 4/2001 | Ehlers et al. |
| 6,236,326 B1 | 5/2001 | Murphy |
| 6,259,074 B1 | 7/2001 | Brunner et al. |
| 6,260,765 B1 | 7/2001 | Natale et al. |
| 6,285,912 B1 | 9/2001 | Ellison et al. |
| 6,288,458 B1 | 9/2001 | Berndt |
| 6,290,140 B1 | 9/2001 | Pesko et al. |
| D448,757 S | 10/2001 | Okubo |
| 6,315,211 B1 | 11/2001 | Sartain et al. |
| 6,318,639 B1 | 11/2001 | Toth |
| 6,321,637 B1 | 11/2001 | Shanks et al. |
| 6,330,806 B1 | 12/2001 | Beaverson et al. |
| 6,344,861 B1 | 2/2002 | Naughton et al. |
| 6,351,693 B1 | 2/2002 | Monie et al. |
| 6,356,038 B2 | 3/2002 | Bishel |
| 6,385,510 B1 | 5/2002 | Hoog et al. |
| 6,394,359 B1 | 5/2002 | Morgan |
| 6,397,612 B1 | 6/2002 | Kernkamp et al. |
| 6,398,118 B1 | 6/2002 | Rosen et al. |
| 6,448,896 B1 | 9/2002 | Bankus et al. |
| 6,449,726 B1 | 9/2002 | Smith |
| 6,453,687 B2 | 9/2002 | Sharood et al. |
| D464,948 S | 10/2002 | Vasquez et al. |
| 6,460,774 B2 | 10/2002 | Sumida et al. |
| 6,466,132 B1 | 10/2002 | Caronna et al. |
| 6,478,233 B1 | 11/2002 | Shah |
| 6,490,174 B1 | 12/2002 | Kompelien |
| 6,502,758 B2 | 1/2003 | Cottrell |
| 6,507,282 B1 | 1/2003 | Sherwood |
| 6,512,209 B1 | 1/2003 | Yano |
| 6,518,953 B1 | 2/2003 | Armstrong |
| 6,518,957 B1 | 2/2003 | Lehtinen et al. |
| 6,546,419 B1 | 4/2003 | Humpleman et al. |
| 6,556,899 B1 | 4/2003 | Harvey et al. |
| 6,566,768 B2 | 5/2003 | Zimmerman et al. |
| 6,574,537 B2 | 6/2003 | Kipersztok et al. |
| 6,578,770 B1 | 6/2003 | Rosen |
| 6,580,950 B1 | 6/2003 | Johnson et al. |
| 6,581,846 B1 | 6/2003 | Rosen |
| 6,587,739 B1 | 7/2003 | Abrams et al. |
| 6,595,430 B1 | 7/2003 | Shah |
| 6,596,059 B1 | 7/2003 | Greist et al. |
| D478,051 S | 8/2003 | Sagawa |
| 6,608,560 B2 | 8/2003 | Abrams |
| 6,619,055 B1 | 9/2003 | Addy |
| 6,619,555 B2 | 9/2003 | Rosen |
| 6,621,507 B1 | 9/2003 | Shah |
| 6,622,925 B2 | 9/2003 | Carner et al. |
| 6,635,054 B2 | 10/2003 | Fjield et al. |
| 6,663,010 B2 | 12/2003 | Chene et al. |
| 6,671,533 B2 | 12/2003 | Chen et al. |
| 6,685,098 B2 | 2/2004 | Okano et al. |
| 6,702,811 B2 | 3/2004 | Stewart et al. |
| 6,726,112 B1 | 4/2004 | Ho |
| D492,282 S | 6/2004 | Lachello et al. |
| 6,771,996 B2 | 8/2004 | Bowe et al. |
| 6,783,079 B2 | 8/2004 | Carey et al. |
| 6,786,421 B2 | 9/2004 | Rosen |
| 6,789,739 B2 | 9/2004 | Rosen |
| 6,801,849 B2 | 10/2004 | Szukala et al. |
| 6,807,041 B2 | 10/2004 | Geiger et al. |
| 6,808,524 B2 | 10/2004 | Lopath et al. |
| 6,810,307 B1 | 10/2004 | Addy |
| 6,810,397 B1 | 10/2004 | Qian et al. |
| 6,824,069 B2 | 11/2004 | Rosen |
| 6,833,990 B2 | 12/2004 | LaCroix et al. |
| 6,842,721 B2 | 1/2005 | Kim et al. |
| 6,851,621 B1 | 2/2005 | Wacker et al. |
| 6,868,293 B1 | 3/2005 | Schurr et al. |
| 6,893,438 B2 | 5/2005 | Hall et al. |
| 6,934,862 B2 | 8/2005 | Sharood et al. |
| D512,208 S | 12/2005 | Kubo et al. |
| 6,973,410 B2 | 12/2005 | Seigel |
| 7,001,495 B2 | 2/2006 | Essalik et al. |
| 7,013,845 B1 | 3/2006 | McFarland et al. |
| D520,989 S | 5/2006 | Miller |
| 7,050,026 B1 | 5/2006 | Rosen |
| 7,055,759 B2 | 6/2006 | Wacker et al. |
| 7,080,358 B2 | 7/2006 | Kuzmin |
| 7,083,109 B2 | 8/2006 | Pouchak |
| 7,083,189 B2 | 8/2006 | Ogata |
| 7,084,774 B2 | 8/2006 | Martinez |
| 7,089,088 B2 | 8/2006 | Terry et al. |
| 7,108,194 B1 | 9/2006 | Hankins, II |
| 7,119,431 B1 | 10/2006 | Hopper et al. |
| 7,130,719 B2 | 10/2006 | Ehlers et al. |
| D531,588 S | 11/2006 | Peh |
| 7,133,748 B2 | 11/2006 | Robinson |
| D533,515 S | 12/2006 | Klein et al. |
| 7,146,253 B2 | 12/2006 | Hoog et al. |
| 7,152,806 B1 | 12/2006 | Rosen |
| 7,156,318 B1 | 1/2007 | Rosen |
| 7,163,156 B2 | 1/2007 | Kates |
| 7,188,002 B2 | 3/2007 | Chapman, Jr. et al. |
| D542,236 S | 5/2007 | Klein et al. |
| 7,212,887 B2 | 5/2007 | Shah et al. |
| 7,222,800 B2 | 5/2007 | Wruck et al. |
| 7,225,054 B2 | 5/2007 | Amundson et al. |
| 7,231,605 B1 | 6/2007 | Ramakasavan |
| 7,232,075 B1 | 6/2007 | Rosen |
| 7,240,289 B2 | 7/2007 | Naughton et al. |
| 7,244,294 B2 | 7/2007 | Kates |
| 7,261,762 B2 | 8/2007 | Kang et al. |
| 7,263,283 B2 | 8/2007 | Knepler |
| 7,274,973 B2 | 9/2007 | Nichols et al. |
| 7,302,642 B2 | 11/2007 | Smith et al. |
| 7,331,187 B2 | 2/2008 | Kates |
| 7,331,426 B2 | 2/2008 | Jahkonen |
| 7,341,201 B2 | 3/2008 | Stanimirovic |
| 7,354,005 B2 | 4/2008 | Carey et al. |
| RE40,437 E | 7/2008 | Rosen |
| 7,419,532 B2 | 9/2008 | Sellers et al. |
| 7,435,278 B2 | 10/2008 | Terlson |
| 7,451,606 B2 | 11/2008 | Harrod |
| 7,452,396 B2 | 11/2008 | Terlson et al. |
| 7,476,988 B2 | 1/2009 | Mulhouse et al. |
| 7,489,094 B2 | 2/2009 | Steiner et al. |
| 7,496,627 B2 | 2/2009 | Moorer et al. |
| 7,500,026 B2 | 3/2009 | Fukanaga et al. |
| 7,505,914 B2 | 3/2009 | McCall |

(56) References Cited

U.S. PATENT DOCUMENTS

| | | |
|---|---|---|
| 7,542,867 B2 | 6/2009 | Steger et al. |
| 7,556,207 B2 | 7/2009 | Mueller et al. |
| 7,574,283 B2 | 8/2009 | Wang et al. |
| 7,584,897 B2 | 9/2009 | Schultz et al. |
| 7,594,960 B2 | 9/2009 | Johansson |
| 7,595,613 B2 | 9/2009 | Thompson et al. |
| 7,600,694 B2 | 10/2009 | Helt et al. |
| 7,604,046 B2 | 10/2009 | Bergman et al. |
| 7,617,691 B2 | 11/2009 | Street et al. |
| 7,636,615 B2 | 12/2009 | Pfingsten et al. |
| 7,642,674 B2 | 1/2010 | Mulhouse et al. |
| 7,644,591 B2 | 1/2010 | Singh et al. |
| 7,665,019 B2 | 2/2010 | Jaeger |
| 7,676,282 B2 | 3/2010 | Bosley |
| 7,692,559 B2 | 4/2010 | Face et al. |
| 7,707,189 B2 | 4/2010 | Haselden et al. |
| 7,713,339 B2 | 5/2010 | Johansson |
| 7,739,282 B1 | 6/2010 | Smith et al. |
| 7,755,220 B2 | 7/2010 | Sorg et al. |
| 7,770,242 B2 | 8/2010 | Sell |
| 7,786,620 B2 | 8/2010 | Vuk et al. |
| 7,793,056 B2 | 9/2010 | Boggs et al. |
| 7,814,516 B2 | 10/2010 | Stecyk et al. |
| 7,837,676 B2 | 11/2010 | Sinelnikov et al. |
| 7,838,803 B1 | 11/2010 | Rosen |
| 7,852,645 B2 | 12/2010 | Fouquet et al. |
| 7,859,815 B2 | 12/2010 | Black et al. |
| 7,865,252 B2 | 1/2011 | Clayton |
| 7,904,608 B2 | 3/2011 | Price |
| 7,941,431 B2 | 5/2011 | Bluhm et al. |
| 7,952,485 B2 | 5/2011 | Schecter et al. |
| 7,956,719 B2 | 6/2011 | Anderson, Jr. et al. |
| 7,957,775 B2 | 6/2011 | Allen, Jr. et al. |
| 7,984,220 B2 | 7/2011 | Gerard et al. |
| 7,992,764 B2 | 8/2011 | Magnusson |
| 7,992,794 B2 | 8/2011 | Leen et al. |
| 8,032,254 B2 | 10/2011 | Amundson et al. |
| 8,060,470 B2 | 11/2011 | Davidson et al. |
| 8,087,593 B2 | 1/2012 | Leen |
| 8,091,796 B2 | 1/2012 | Amundson et al. |
| 8,110,945 B2 | 2/2012 | Simard et al. |
| 8,136,738 B1 | 3/2012 | Kopp |
| 8,138,634 B2 | 3/2012 | Ewing et al. |
| 8,167,216 B2 | 5/2012 | Schultz et al. |
| 8,183,818 B2 | 5/2012 | Elhalis |
| 8,216,216 B2 | 7/2012 | Warnking et al. |
| 8,219,249 B2 | 7/2012 | Harrod et al. |
| 8,239,066 B2 | 8/2012 | Jennings et al. |
| 8,269,376 B1 | 9/2012 | Elberbaum |
| 8,276,829 B2 | 10/2012 | Stoner et al. |
| 8,280,556 B2 | 10/2012 | Besore et al. |
| 8,314,517 B2 | 11/2012 | Simard et al. |
| 8,346,396 B2 | 1/2013 | Amundson et al. |
| 8,410,634 B2 | 4/2013 | Park |
| 8,417,091 B2 | 4/2013 | Kim et al. |
| 8,437,878 B2 | 5/2013 | Grohman et al. |
| 8,511,577 B2 | 8/2013 | Warren et al. |
| 8,523,083 B2 | 9/2013 | Warren et al. |
| 8,532,190 B2 | 9/2013 | Shimizu et al. |
| 8,554,374 B2 | 10/2013 | Lunacek et al. |
| 8,574,343 B2 | 11/2013 | Bisson et al. |
| 8,604,746 B2 | 12/2013 | Lee |
| 8,613,792 B2 | 12/2013 | Ragland et al. |
| 8,621,881 B2 | 1/2014 | Votaw et al. |
| 8,623,117 B2 | 1/2014 | Zavodny et al. |
| 8,629,661 B2 | 1/2014 | Shimada et al. |
| 8,680,442 B2 | 3/2014 | Reusche et al. |
| 8,704,672 B2 | 4/2014 | Hoglund et al. |
| 8,729,875 B2 | 5/2014 | Vanderzon |
| 8,731,723 B2 | 5/2014 | Boll et al. |
| 8,734,565 B2 | 5/2014 | Hoglund et al. |
| 8,752,771 B2 | 6/2014 | Warren et al. |
| 8,768,341 B2 | 7/2014 | Coutelou et al. |
| 8,881,172 B2 | 11/2014 | Schneider |
| 8,886,179 B2 | 11/2014 | Pathuri et al. |
| 8,886,314 B2 | 11/2014 | Crutchfield et al. |
| 8,892,223 B2 | 11/2014 | Leen et al. |
| 8,902,071 B2 | 12/2014 | Barton et al. |
| 9,002,523 B2 | 4/2015 | Erickson et al. |
| 9,071,145 B2 | 6/2015 | Simard et al. |
| 9,080,784 B2 | 7/2015 | Dean-Hendricks et al. |
| 9,098,279 B2 | 8/2015 | Mucignat et al. |
| 9,143,006 B2 | 9/2015 | Lee et al. |
| 9,148,067 B2 | 9/2015 | Karlsson et al. |
| 9,206,993 B2 | 12/2015 | Barton et al. |
| 9,234,877 B2 | 1/2016 | Hattersley et al. |
| 9,261,287 B2 | 2/2016 | Warren et al. |
| 9,264,035 B2 | 2/2016 | Tousignant et al. |
| 9,272,647 B2 | 3/2016 | Gawade et al. |
| 9,366,448 B2 | 6/2016 | Dean-Hendricks et al. |
| 9,374,268 B2 | 6/2016 | Budde et al. |
| 9,419,602 B2 | 8/2016 | Tousignant et al. |
| 9,628,074 B2 * | 4/2017 | Tousignant ............ H02M 1/44 |
| 2001/0029585 A1 | 10/2001 | Simon et al. |
| 2001/0052459 A1 | 12/2001 | Essalik et al. |
| 2002/0011923 A1 | 1/2002 | Cunningham et al. |
| 2002/0022991 A1 | 2/2002 | Sharood et al. |
| 2002/0082746 A1 | 6/2002 | Schubring et al. |
| 2002/0092779 A1 | 7/2002 | Essalik et al. |
| 2003/0033230 A1 | 2/2003 | McCall |
| 2003/0034897 A1 | 2/2003 | Shamoon et al. |
| 2003/0034898 A1 | 2/2003 | Shamoon et al. |
| 2003/0040279 A1 | 2/2003 | Ballweg |
| 2003/0060821 A1 | 3/2003 | Hall et al. |
| 2003/0103075 A1 | 6/2003 | Rosselot |
| 2003/0177012 A1 | 9/2003 | Drennan |
| 2004/0262410 A1 | 12/2004 | Hull |
| 2005/0083168 A1 | 4/2005 | Breitenbach |
| 2005/0180179 A1 * | 8/2005 | Hirst ...................... H02M 1/34 363/21.07 |
| 2005/0270151 A1 | 12/2005 | Winick |
| 2006/0112700 A1 | 6/2006 | Choi et al. |
| 2006/0196953 A1 | 9/2006 | Simon et al. |
| 2006/0242591 A1 | 10/2006 | Van Dok et al. |
| 2007/0013534 A1 | 1/2007 | DiMaggio |
| 2007/0045429 A1 | 3/2007 | Chapman, Jr. et al. |
| 2007/0114293 A1 | 5/2007 | Gugenheim |
| 2007/0114295 A1 | 5/2007 | Jenkins et al. |
| 2007/0119961 A1 | 5/2007 | Kaiser |
| 2007/0241203 A1 | 10/2007 | Wagner et al. |
| 2007/0277061 A1 | 11/2007 | Ashe |
| 2007/0289731 A1 | 12/2007 | Deligiannis et al. |
| 2007/0290924 A1 | 12/2007 | McCoy |
| 2007/0296260 A1 | 12/2007 | Stossel |
| 2008/0015740 A1 | 1/2008 | Osann |
| 2009/0143880 A1 | 6/2009 | Amundson et al. |
| 2009/0165644 A1 | 7/2009 | Campbell |
| 2010/0006660 A1 | 1/2010 | Leen et al. |
| 2010/0084482 A1 | 4/2010 | Kennedy et al. |
| 2010/0204834 A1 | 8/2010 | Comerford et al. |
| 2011/0073101 A1 | 3/2011 | Lau et al. |
| 2011/0133558 A1 | 6/2011 | Park |
| 2011/0185895 A1 | 8/2011 | Freen |
| 2011/0251807 A1 | 10/2011 | Rada et al. |
| 2011/0291606 A1 | 12/2011 | Lee |
| 2012/0323377 A1 | 12/2012 | Hoglund et al. |
| 2013/0158714 A1 | 6/2013 | Barton et al. |
| 2013/0158715 A1 | 6/2013 | Barton et al. |
| 2013/0158717 A1 | 6/2013 | Zywicki et al. |
| 2013/0158718 A1 | 6/2013 | Barton et al. |
| 2013/0158720 A1 | 6/2013 | Zywicki et al. |
| 2013/0213952 A1 | 8/2013 | Boutin et al. |
| 2013/0238142 A1 | 9/2013 | Nichols et al. |
| 2013/0245838 A1 | 9/2013 | Zywicki et al. |
| 2013/0261807 A1 | 10/2013 | Zywicki et al. |
| 2014/0062672 A1 | 3/2014 | Gudan et al. |
| 2014/0312131 A1 | 10/2014 | Tousignant et al. |
| 2014/0312697 A1 | 10/2014 | Landry et al. |
| 2014/0368036 A1 * | 12/2014 | Houde .................... H02M 1/08 307/31 |
| 2015/0001929 A1 | 1/2015 | Juntunen et al. |
| 2015/0001930 A1 | 1/2015 | Juntunen et al. |
| 2015/0002165 A1 | 1/2015 | Juntunen et al. |
| 2015/0115045 A1 | 4/2015 | Tu et al. |

(56) References Cited

U.S. PATENT DOCUMENTS

| | | | |
|---|---|---|---|
| 2015/0144706 | A1 | 5/2015 | Robideau et al. |
| 2015/0145347 | A1 | 5/2015 | Kim et al. |
| 2015/0370265 | A1 | 12/2015 | Ren et al. |
| 2015/0370268 | A1 | 12/2015 | Tousignant et al. |
| 2016/0010880 | A1 | 1/2016 | Bravard et al. |
| 2017/0134214 | A1 | 5/2017 | Sethuraman et al. |
| 2017/0192061 | A1 | 7/2017 | Park |
| 2017/0235291 | A1 | 8/2017 | Foslien et al. |

FOREIGN PATENT DOCUMENTS

| | | | |
|---|---|---|---|
| EP | 0070414 | A1 | 1/1983 |
| EP | 0434926 | B1 | 8/1995 |
| EP | 0976957 | A2 | 2/2000 |
| EP | 0678204 | B1 | 3/2000 |
| EP | 0985994 | A1 | 3/2000 |
| EP | 1033641 | A1 | 9/2000 |
| EP | 1143232 | A1 | 10/2001 |
| EP | 1074009 | B1 | 3/2002 |
| EP | 2138919 | A1 | 12/2009 |
| FR | 2491692 | A1 | 4/1982 |
| FR | 2711230 | A1 | 4/1995 |
| WO | 9711448 | A1 | 3/1997 |
| WO | 9739392 | A1 | 10/1997 |
| WO | 0043870 | A2 | 7/2000 |
| WO | 0152515 | A1 | 7/2001 |
| WO | 0179952 | A1 | 10/2001 |
| WO | 0223744 | A2 | 3/2002 |
| WO | 2010021700 | A1 | 2/2010 |

OTHER PUBLICATIONS

CorAccess, "Companion 6," User Guide, pp. 1-20, Jun. 17, 2002.
Danfoss RT51/51 RF & RT52/52RF User Instructions, 2 pages, Jun. 2004.
DeKoven et al., "Designing Collaboration in Consumer Products," 2 pages, 2001.
DeKoven et al., "Measuring Task Models in Designing Intelligent Products," 2 pages, Jan. 13-16, 2002.
DESA Heating Products, "Wireless Hand-Held Remote Control Sets Models (C) GHRCB and (C)GHRCTB, Operating Instructions,". 4 pages, May 2003.
Domotique Secant Home Automation—Web Page, available at http://www.secant.ca/En/Company/Default.asp, 1 page, printed Sep. 28, 2004.
Emme Core User Guide, Version 1.1, 47 pages, Jan. 2011.
Firex Smoke Alarm, Ionization Models AD, ADC Photoelectric Model Pad, 4 pages, prior to Apr. 21, 2005.
Fluke, "561 HVAC Pro" Infrared Thermometer User's Manual, 22 pages, Downloaded May 24, 2012.
Freudenthal et al., "Communicating Extensive Smart Home Functionality to Users of All Ages: the Design of a Mixed-Initiative Multimodal Thermostat-Interface," pp. 34-39, Mar. 12-13, 2001.
Gentex Corporation, HD135, 135° Fixed Temperature Heat Detector AC Pwered, 120V, 60Hz With Battery Backup, Installation Instructions—Owner's Information, pp. 1-5, Jun. 1, 1998.
Gentex Corporation, 9000 Series, Photoelectric Type Single Station/Multi-Station Smoke Alarms AC Powered With Battery Backup, Installation Instructions—Owner's Information, pp. 9-1 to 9-6, Jan. 1, 1993.
Harris et al., "Optimizing Memory Transactions," Microsoft Research Havard University, 12 pages, May 25, 2012.
Honeywell Brivis Deluxe Programmable Thermostat, pp. 1-20, 2002.
Honeywell Brivis T8602C Chronotherm IV Deluxe Programmable Thermostats, Installation Instructions, pp. 1-12, 2002.
Honeywell CT8602C Professional Fuel Saver Thermostat, pp. 1-6, 1995.
Honeywell Electronic Programmable Thermostat, Owner's Guide, pp. 1-20, 2003.
Honeywell Electronic Programmable Thermostats, Installation Instructions, pp. 1-8, 2003.
Honeywell News Release, "Honeywell's New Sysnet Facilities Integration System for Boiler Plant and Combustion Safety Processes," 4 pages, Dec. 15, 1995.
Honeywell T8002 Programmable Thermostat, Installation Instructions, pp. 1-8, 2002.
Honeywell T8602A,B,C,D and TS8602A,C Chronotherm III Fuel Saver Thermostats, Installation Instructions, pp. 1-12, 1995.
Honeywell T8602D Chronotherm IV Deluxe Programmable Thermostats, Installation Instructions, pp. 1-12, 2002.
Honeywell TH8000 Series Programmable Thermostats, Owner's Guide, pp. 1-44, 2004.
Honeywell, "Excel Building Supervisor-Integrated R7044 and FS90 Ver. 2.0," Operator Manual, 70 pages, Apr. 1995.
Honeywell, "Installation Guide: Wireless Entry/Exit Remote," 12 pages, 2011.
Honeywell, "Introduction of the S7350A Honeywell WebPAD Information Appliance," Home and Building Control Bulletin, 2 pages, Aug. 29, 2000; Picture of WebPad Device with touch screen, 1 Page; and screen shots of WebPad Device, 4 pages.
Honeywell, "RedLINK™ Wireless Comfort Systems," RedLINK Wireless Technology, 8 pages, Aug. 2011.
Honeywell, "Total Connect Online Help Guide," Revision A, 800-02577-TC, Mar. 2010.
Honeywell, "Total Connect User Guide," Revision B, 34 pages, May 15, 2012.
Honeywell, "VisionPRO® 8000 Thermostats," downloaded from http://yourhome.honeywell.com, 2 pages, May 24, 2012.
Honeywell, "W7006A Home Controller Gateway User Guide," 31 pages, Jul. 2001.
Honeywell, MagicStat® CT3200 Programmable Thermostat, Installation and Programming Instructions, pp. 1-24, 2001.
Honeywell, Wireless Entry/Exit Remote, Operating Manual, 9 pages, 2011.
http://hunter-thermostats.com/hunter_programmable_thermostats.html, Hunter Thermostat 44668 Specifications, and 44758 Specifications, 2 pages, Printed Jul. 13, 2011.
http://www.cc.gatech.edu/computing/classes/cs6751_94_fall/groupc/climate-2/node1.html, "Contents," 53 pages, printed Sep. 20, 2004.
http://www.ritetemp.info/rtMenu_13.html, Rite Temp 8082, 6 pages, printed Jun. 20, 2003.
http://www.thermostatsales.com, Robertshaw, "9610 Digital Programmable Thermostat," 3 pages, printed Jun. 17, 2004.
http://www.thermostatsales.com, Robertshaw, "9700 Deluxe Programmable Thermostat" 3 pages, printed Jun. 17, 2004.
http://www.thermostatsales.com, Robertshaw, "9710 Deluxe Programmable Thermostat," 3 pages, printed Jun. 17, 2004.
http://www.thermostatsales.com, Robertshaw, "9720 Deluxe Programmable Thermostat," 3 pages, printed Jun. 17, 2004.
Hunter, "44200/44250," Owner's Manual, 32 pages, prior to Jul. 7, 2004.
Hunter, "44300/44350," Owner's Manual, 35 pages, prior to Jul. 7, 2004.
Hunter, "Auto Saver 550", Owner's Manual Model 44550, 44 pages, prior to Jul. 7, 2004.
Hunter, "Model 44758 Remote Sensor," Owner's Manual, 2 pages, Revision Sep. 4, 2008.
Install Guide for Ritetemp Thermostat 8082, 6 pages, 2002.
Invensys™, "9700i 9701i 9715i 9720i Deluxe Programmable Thermostats," User's Manual, pp. 1-28, prior to Jul. 7, 2004.
Larsson, "Battery Supervision in Telephone Exchanges," Ericsson Components AB Sweden, 5 pages, Downloaded May 5, 2012.
Lennox, "Network Control Panel (NCP)," User's Manual, 18 pages, Nov. 1999.
Lennox, "Prodigy Control System," Lennox Industries, 4 pages, May 25, 2012.
White-Rodgers 1F80-224 Programmable Electronic Digital Thermostat, Installation and Operation Instructions, 8 pages, prior to Apr. 21, 2005.
White-Rodgers Comfort-Set III Thermostat, pp. 1-44, prior to Jul. 7, 2004.

(56) References Cited

OTHER PUBLICATIONS

White-Rodgers Installation Instructions for Heating & Air Conditioning IF78 Non-Programmable Thermostat, 6 pages, prior to Apr. 21, 2005.
White-Rodgers Installation Instructions for Heating & Air Conditioning IF78 5/2 Day Programmable Thermostat, 7 pages, prior to Jul. 7, 2004.
White-Rodgers, "Installation Instructions for Heating & Air Conditioning IF72 5/2 Day Programmable Heat Pump Thermostat," 8 pages, prior to Jul. 7, 2004.
White-Rodgers, "Comfort-Set 90 Series Thermostat," Manual, pp. 1-24, prior to Jul. 7, 2004.
White-Rodgers, 1F80-240 "(for Heating Only systems) Programmable Electronic Digital Thermostat," Installation and Operation Instructions, 8 pages, prior to Jul. 7, 2004.
White-Rodgers, 1F80-241 "Programmable Electronic Digital Thermostat," Installation and Operation Instructions, 6 pages, prior to Jul. 7, 2004.
White-Rodgers, 1F80-261 "Programmable Electronic Digital Thermostat," Installation and Operation Instructions, 8 pages, prior to Jul. 7, 2004.
White-Rodgers, 1F81-261 "Programmable Electronic Digital Multi-Stage Thermostat," Installation and Operation Instructions, 8 pages, prior to Jul. 7, 2004.
White-Rodgers, 1F82-261 "Programmable Electronic Digital Heat Pump Thermostat," Installation and Operation Instructions, 8 pages, prior to Jul. 7, 2004.
White-Rodgers, Comfort-Set 90 Series Premium, 4 pages, prior to Apr. 21, 2005.
www.icmcontrols.com, Simplecomfort, SC3000 Single Stage Heat/Single Stage Cool or Single Stage Heat Pump/Manual Changeover, 1 page, prior to Jul. 7, 2004.
www.icmcontrols.com, Simplecomfort, SC3001 Single Stage Heat/Single Stage Cool or Single Stage Heat Pump/Manual Changeover, 1 page, prior to Jul. 7, 2004.
www.icmcontrols.com, Simplecomfort, SC3006 Single Stage Heat/Single Stage Cool or Single Stage Heat Pump/Manual Changeover, 1 page, prior to Jul. 7, 2004.
www.icmcontrols.com, Simplecomfort, SC3201 2 Stage Heat Pump Manual Changeover, 1 page, prior to Jul. 7, 2004.
www.icmcontrols.com, Simplecomfort, SC3801 2 Stage Heat/2 Stage Cool 2 Stage Heat Pump/Audio Changeover, 1 page, prior to Jul. 7, 2004.
Inventek, "Inventek Systems, ISM4319-M3X-L44-X Embedded Serial-to-Wi-Fi Module eS-WiFi 802.11 b/g/n Data Sheet", ,Inventek, "Inventek Systems, ISM4319-M3X-L44-X Embedded Serial-to-Wi-Fi Module eS-WiFi 802.11 b/g/n Data Sheet", accessed from http://www.inventeksys.com/wp-content/uplo . . . Feb. 6, 2012.
Cirrus Logic, Inc., "CS1501 Digital Power Factor Correction Control IC," 16 pages, 2012.
International Search Report for Corresponding Application No. PCT/US2014/044229, dated Oct. 13, 2014.
U.S. Appl. No. 14/300,232, filed Jun. 9, 2014.
Hendon Semiconductors, "OM1894 Dual Sensing Precision Triac Control," Product Specification, Rev. 2.0, 21 pages, Apr. 19, 2007.
Honeywell, "System Installation Guide: Important Instructions," Honeywell International Inc., 25 pages, 2011.
Http://www.dimplex.com/en/home_heating/linear_convector_baseboards/products/lpc_series/linear_proportional_convector, Dimplex Coporation, "Linear Convector LPC Series," 2 pages, May 2011.
Http://www.enernetcorp.com/, Enernet Corporation, "Wireless Temperature Control" 1 page, 2011.
Http://www.enernetcorp.com/t9000-wireless-thermostat.html, Enernet Corporation, "T9000 Series Wireless Fan Coil Thermostat," Product Brochure, 2 pages, 2011.
Http://www.enocean-alliance.org/en/products/regulvar_rw-ssr347-15a/, Regulvar Corporation, "RW-SSR347-15A, Relais sans fil à semi-conducteurs" 3 pages, Aug. 8, 2009.
Http://www.enocean-alliance.org/en/products/regulvar_rw-tp01/, Regulvar Corporation, "RW-TP01, Capteur de température sans fil" 3 pages, Aug. 9, 2009.
Http://www.forwardthinking.honeywell.com/products/wireless/focus_pro/focus_pro_feature.html, Honeywell Corporation, "Wireless FocusPRO® ", 2 pages, 2011.
Signetics Linear Products, "TDA1024 Zero Crossing Triac Trigger," Product Specification, 14 pages, Sep. 1985.
"RCS X10 Thermostat Plug-in for HomeSeer Beta Version 2.0. 105," 25 pages, prior to Sep. 7, 2011.
"CorAccess Systems/In Home," http://web.archive.org/web20011212084427/www.coraccess.com/home.html, 1 page, copyright 2001, printed Aug. 19, 2004.
"HAI Company Background," http://www.homeauto.com/AboutHAI/abouthai_main.htm, 2 pages, printed Aug. 19, 2004.
"High-tech options take hold in new homes—200-08-28—Dallas Business Journal," http://bizjournals.com/dallas/stories/2000/08/28/focus4, 3 pages, dated Aug. 28, 2000, printed Aug. 19, 2004.
"Home Toys Review—TouchLinc", http://www.hometoys.com/htinews/aug99/reviews/touchlinc/touchlinc.htm, 3 pages, dated Aug. 1999, printed Aug. 20, 2004.
"HTI News Release," http://www.hometoys.com/htinews/apr99/releases/ha101.htm, 3 pages, Apr. 1999.
"Mark of Excellence Award Finalist Announced," http://64.233.167.104/search?Q=cache:ciOA2YtYaBIJ:www. hometoys.com/releases/mar . . . , 6 pages, Leopard Touchscreen on p. 2, dated prior to Mar. 4, 2000, printed Aug. 20, 2004.
"Product Review—Philips Pronto Remote Control," http://hometheaterhifi.com/volume_6_2/philipsprontoremotecontrol.html, 5 pages, dated May 1999, printed Aug. 20, 2004.
"RC X10 Automation Forum: Control your Heating and Cooling System with Pronto(1/1)," http://www.remotecentral.com/cgi-bin/mboard/rc-x10/thread.cgi?12, 2 pages, dated Apr. 23, 1999, printed Aug. 20, 2004.
"Spotlight on integrated systems," Custom Builder, vol. 8, No. 2, p. 66(6), Mar.-Apr. 1993.
"Vantage Expands Controls for Audio/Video, HVAC and Security," http://www.hometoys.com/htinews/aug99/releases/vantage03.htm, 2 pages, dated Aug. 3, 1999, printed Aug. 20, 2004.
ADI, "Leopard User Manual," 93 pages, 2001.
Adicon 2500, "The Automator," 4 pages, Oct.-Dec. 2000.
ADT Security Services, "iCenter Advanced User Interface B142ADT," Installation and Setup Guide, 4 pages, May 2001; First Sale Feb. 2001.
AED Electronics, Inc., "Presenting Climatouch the Most Innovative Thermostat in the World!," 2 pages, prior to Nov. 30, 2007.
Andrews et al., "Clicky: User-Centric Input for Active Spaces," 17 pages, Aug. 2004.
Aprilaire Electronic Thermostats Models 8344, 8346, 8348, 8363, 8365, 8366 Operating Instructions, 8 pages, 2003.
Aube Technologies, Electronic Thermostat for Heating System Model TH135-01, 5 pages, Aug. 14, 2001.
Aube Technologies, TH140-28 Electronic Programmable Thermostat, Installation Instructions and User Guide, pp. 1-4, Jan. 22, 2004.
AutomatedBuildings.com Article—"Thin Client" Solutions, "Pressure, Air Flow, Temperature, Humidity & Valves," Dwyer Instruments, Inc., 5 pages, printed Sep. 20, 2004.
Blake et al., "Seng 310 Final Project Demo Program" Illustration, 3 pages, Apr. 6, 2001.
Blake et al., "Seng 310 Final Project" Report, dated Apr. 6, 2001.
Blister Pack Insert from a Ritetemp 8082 Touch Screen Thermostat Product, 2 pages, 2002.
Braeburn Model 3000 Owner's Manual, pp. 1-13, 2001.
Braeburn Model 5000 Owner's Manual, pp. 1-17, 2001.
BRK Electronics Maximum Protection Plus Ultimate Convenience Smoke Alarm, 24 pages, Sep. 2000.
BRK First Alert, User's Manual, Smoke and Fire Alarms, pp. 1-7, Nov. 2002.
Business Wire, "MicroTouch Specialty Products Group to Capitalize on Growing Market for Low-Cost Digital Matrix Touchscreens," p1174 (2 pages), Jan. 6, 1999.

(56) References Cited

OTHER PUBLICATIONS

Cardio Manual, available at http://www.secant.ca/En/Documentation/Cardio2é-Manual.pdf, Cardio Home Automation Inc., 55 pages, printed Sep. 28, 2004.
Cardio, by Secant; http://www.hometoys.com/htinews/apr98/reviews/cardio.htm, "HTINews Review," Feb. 1998, 5 pages, printed Sep. 14, 2004.
Carrier Microelectronic Programmable Thermostat Owner's Manual, pp. 1-24, May 1994.
Carrier TSTATCCRF01 Programmable Digital Thermostat, pp. 1-21, prior to Apr. 21, 2005.
Carrier, "Edge Performance Programmable Owner's Manual," 64 pages, 2007.
Carrier, "Programmable Dual Fuel Thermostats," Installation, Start-Up & Operating Instructions, pp. 1-12, Oct. 1998.
Carrier, "Programmable Thermostats," Installation, Start-Up & Operating Instructions, pp. 1-16, Sep. 1998.
Carrier, "Standard Programmable I hermostat," Homeowner's Manual, pp. 1-8 pages, 1998.
Carrier, "Thermidistat Control," Installation, Start-Up, and Operating Instructions, pp. 1-12, Aug. 1999.
Carrier, "Comfort Programmable Owner's Manual," Carrier Touch-N-Go, Catalog No. 0M-TCPHP-4CA 60 pages, 2010.
Logitech, "Harmony 880 Remote User Manual," v. 1, pp. 1-15, prior to Nov. 30, 2007.
Lux ELV1 Programmable Line Voltage Thermostat, Installation Instructions, 3 pages, prior to Jul. 7, 2004.
Lux TX500 Series Smart Temp Electronic Thermostat, 3 pages, prior to Jul. 7, 2004.
Lux TX9000 Installation, 3 pages, prior to Apr. 21, 2005.
Lux, "9000RF Remote Instructions," 2 pages, prior to Nov. 30, 2007.
Lux, "511 Series Smart Temp Electronic Thermostat," Owner's Manual, 3 pages, prior to Jul. 7, 2004.
Lux, "600 Series Smart Temp Electronic Thermostat," Owner's Manual, 3 pages, prior to Jul. 7, 2004.
Lux, "602 Series Multi-Stage Programmable Thermostat," Owner's Manual, 2 pages, prior to Jul. 7, 2004.
Lux, "605/2110 Series Programmable Heat Pump Thermostat," Owner's Manual, 3 pages, prior to Jul. 7, 2004.
Lux, "700/9000 Series Smart Temp Electronic Thermostat," Owner's Manual, 3 pages, prior to Jul. 7, 2004.
Lux, "PSPH521 Series Programmable Heat Pump Thermostat," Owner's Manual, 3 pages, prior to Jul. 7, 2004.
Lux, "TX1500 Series Smart Temp Electronic Thermostat," Owner's Manual, 6 pages, prior to Jul. 7, 2004.
METASYS, "HVAC PRO for Windows User's Manual," 308 pages, 1998.
Mounting Template for Ritetemp Thermostat 8082, 1 page, 2002.
Omron Electronic Components, LLC, "Micro Tilt Sensor D6B," Cat. No. JB301-E3-01, 6 pages, Mar. 2005.
Omron Electronic Components, LLC, "Micro Tilt Sensor D6B," Cat. No. B02WAD1, 2 pages, Jun. 2002.
Operation Manual for Ritetemp Touch Screen Thermostat 8082, 8 pages, 2002.
PG&E, "SmartAC Thermostat Programming Web Site Guide," 2 pages, prior to Sep. 7, 2011.
Proliphix, "Web Enabled IP Thermostats, Intelligent HVAC Control," Proliphix Inc., 2 pages, on or before Aug. 28, 2004.
Proliphix, "Web Enabled IP Thermostats, Ultimate in Energy Efficiency!," Proliphix Inc., 2 pages, on or before Aug. 28, 2004.
Proliphix, Inc., "NT10e & NT20e," 54 pages, on or before Aug. 30, 2005.
Quick Start Guide for Ritetemp Thermostat 8082, 1 page, 2002.
Remote Control Power Requirement for Ritetemp Thermostat 8082, 1 page, 2002.
Ritetemp Operation 8029, 3 pages, Jun. 19, 2002.
Ritetemp Operation 8050, 5 pages, Jun. 26, 2002.
Ritetemp Operation 8085, pp. 1-6, prior to Apr. 21, 2005.
Saravanan et al, "Reconfigurable Wireless Interface for Networking Sensors," IJCSNS International Journal of Computer Science and Network Security, vol. 8 No. 7, pp. 270-276. Revised Jul. 20, 2008.
Screenshot of http://lagotek.com/index.html?currentSection=TouchIt, Lagotek, 1 page, prior to Mar. 29, 2012.
Sealed Unit Parts Co., Inc., Supco & CTC Thermostats . . . loaded with features, designed for value!, 6 pages, prior to Apr. 21, 2005.
Sharp Corporation, "GP1S036HEZ Phototransistor Output, Transmissive Photointerrupter with Tilt Direction (4-Direction) Detecting," pp. 1-11, Oct. 3, 2005.
Totaline Model P474-1035 Owner's Manual Programmable 5-2 Day Digital Thermostat, pp. 1-21, Apr. 2003.
Totaline Star CPE230RF, Commercial Programmable Thermostat Wireless Transmitter, Owner's Manual, pp. 1-16, Oct. 1998.
Totaline Star P/N P474-0130 Non-Programmable Digital Thermostat Owner's Manual, pp. 1-22, prior to Apr. 21, 2005.
Totaline, "1 For All Programmable Digital Thermostat," Owner's Manual P/N P374-1100FM, 23 pages, Nov. 1998.
Totaline, "1 for All Programmable Digital Thermostat," Owner's Manual P/N P474-1050, 21 pages, Nov. 1998.
Totaline, "1 for All Programmable Digital Thermostat," Owner's Manual P/N P374-1100, 24 pages, Apr. 2001.
Totaline, "Intellistat Combination Temperature and Humidity Control," Owner's Manual P/N P374-1600, 25 pages, Jun. 2001.
Totaline, "P/N P374-0431 Thermostat Remote Control and Receiver," Owner's Manual, 11 pages, prior to Nov. 30, 2007.
Totaline, "P474-1100RF, P474-1100REC Wireless Thermostat," 1 page, prior to Nov. 30, 2007.
Totaline, "Programmable Thermostat Configurable for Advanced Heat Pump or Dual Fuel Operation," Owner's Manual P/N P374-1500, 24 pages, Jun. 1999.
Totaline, "Wireless Remote Sensor, Model P474-0401-1RF/REC," 2 pages, prior to Nov. 30, 2007.
Totaline, "Instructions P/N P474-1010", Manual, 2 pages, Dec. 1998.
Totaline, "Programmable Thermostat", Homeowner's Guide, 27 pages, Dec. 1998.
Totaline, "Wireless Programmable Digital Thermostat," Owner's Manual 474-1100RF, 22 pages, 2000.
Trane, "System Programming, Tracer Summit Version 14, BMTW-SVP01D-EN," 623 pages, 2002.
Trane, "Wireless Zone Sensor. Where Will Wireless Technology Take You?," 4 pages, Feb. 2006.
Travis Industries, Remote Fireplace Thermostat, Part #99300651, 6 pages, printed Feb. 3, 2003.
Trouble Shooting Guide for Ritetemp Thermostat 8082, 1 page, 2002.
Visor Handheld User Guide, 280 pages, Copyright 1999-2000.
Warmly Yours, "Model TH111GFCI-P (120 VAC)," Manual, pp. 1-4, prior to Jul. 7, 2004.
Office Action for Canadian Application No. 2,774,907, dated Nov. 3, 2017.

\* cited by examiner

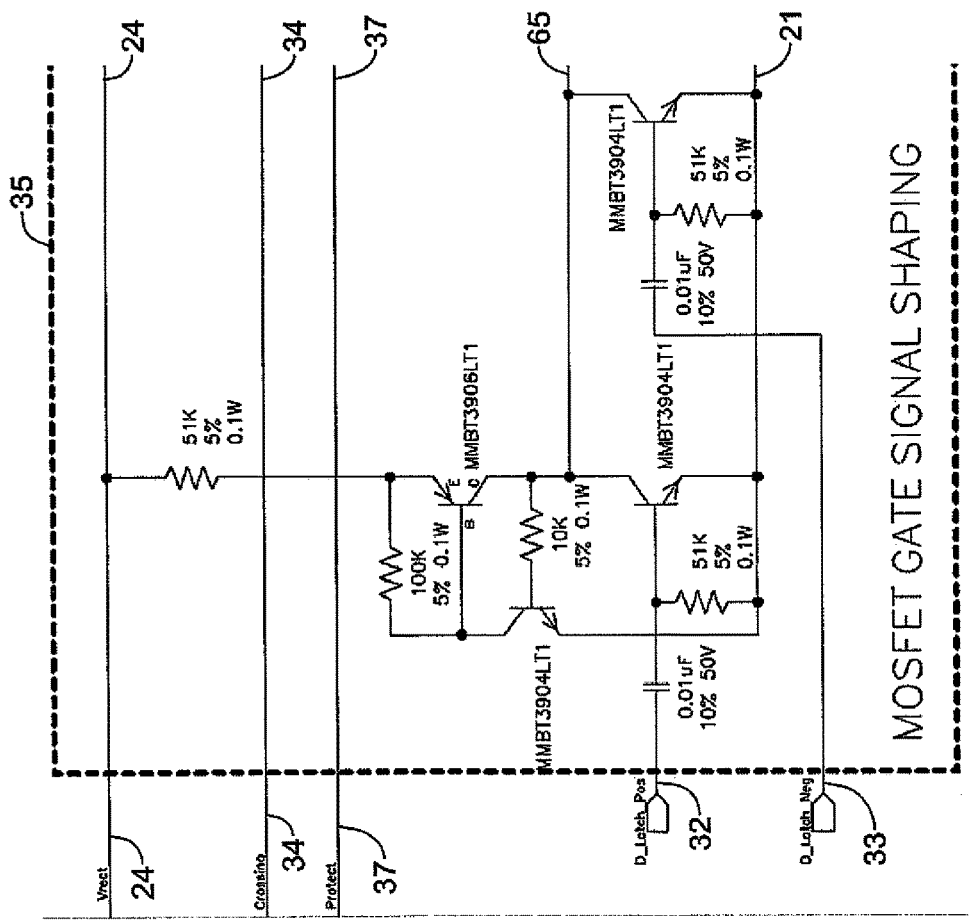

BYPASS SWITCH FOR IN-LINE POWER STEAL

This application is a continuation of U.S. patent application Ser. No. 14/309,553, filed Jun. 19, 2014. U.S. patent application Ser. No. 14/309,553, filed Jun. 19, 2014, is hereby incorporated by reference.

BACKGROUND

The present disclosure pertains to thermostats and particularly to various kinds of power supply arrangements for thermostats.

SUMMARY

The disclosure reveals a power supply unit for use with thermostats or other like devices. The power supply unit may keep electromagnetic interference emissions and harmonics at a minimum. A unit may have enough power for triggering a switch at about a cross over point of a waveform of input power to the unit. Power for triggering may come from a storage source. Power for the storage source may be provided with power stealing which require switching transistors which can generate emissions. In-line thermostats using MOSFETS power steal may do the power steal during an ON state (triac, relay or silicon controlled rectifier activated). Gate signals to the transistors may be especially shaped to keep emissions from transistor switching at a minimum. All that may be needed, during an OFF state as a bypass, is a high voltage controllable switch. The need may be achieved using high voltage MOSFETS.

BRIEF DESCRIPTION OF THE DRAWING

FIG. 8a and FIG. 8b are diagrams of a MOSFET gate signal shaping circuit;

DESCRIPTION

The present system and approach may incorporate one or more processors, computers, controllers, user interfaces, wireless and/or wire connections, and/or the like, in an implementation described and/or shown herein.

This description may provide one or more illustrative and specific examples or ways of implementing the present system and approach. There may be numerous other examples or ways of implementing the system and approach.

There may be a need for a new kind of bypass which is non-current limited, inexpensive, small space, power dissipation proportional to current consumption, audible noise free and electromagnetic interference compliant.

Since in-line thermostats using MOSFETS (metal-oxide-semiconductor field-effect transistors) power steal may already do the power steal during the ON state (triac, relay or silicon controlled rectifier (SCR) activated). All that may be needed, during the OFF state as a bypass, is a high voltage controllable switch. This may be achieved using high voltage MOSFETS.

The thermostats may relate to HVAC (heating, ventilation and air conditioning) systems.

Using the same synchronization as for a MOSFET power steal, one may synchronize the MOSFET switch. For an energy hungry application, the peak current through the switch can became very high since the power steal is half wave only. So, a second switch with small modification to the synchronization circuit may be added to make a full wave switch and reduce harmonics.

The present approach may be used with an in-line controller doing MOSFET power steal like the line volt thermostat. It may allow a circuit to be universal for virtually all thermostats, and that has characteristics such as being non-current limited, inexpensive, situated in a small space, having power dissipation proportional to current consumption, and being audible noise free and electromagnetic interference compliant. The present approach may use one or more switches in a power steal circuit for an in-line thermostat.

Figure 1A:
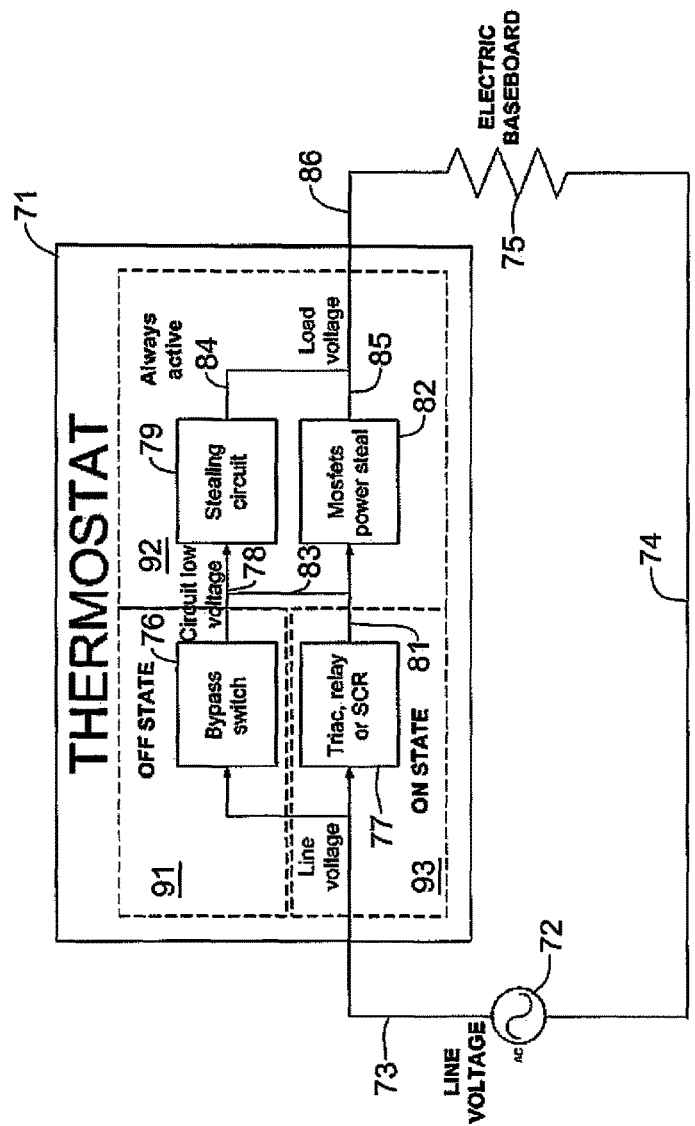
FIG. 1a is a block diagram of a thermostat circuit.

FIG. 1a is a block diagram of a thermostat circuit 71 discussed herein. An AC (alternating current) line voltage may be provided by power supply 72 on lines 73 and 74 to thermostat 71 and electric baseboard 75. Line voltage on line 73 may go to a bypass switch 76 and triac, relay or SCR 77. Circuit low voltage may go along line 78 to stealing circuit 79. A connection may go from triac, relay or SCR 77 to a MOSFETs power steal along line 81. Lines 78 and 81 may be connected by a line 83. A load voltage may connect stealing circuit 79 and MOSFETs power steal along lines 84 and 85 via line 86 to electric baseboard 75. Areas 91, 92 and 93 indicate off state, always active and on state, respectively.

Figure 1B:
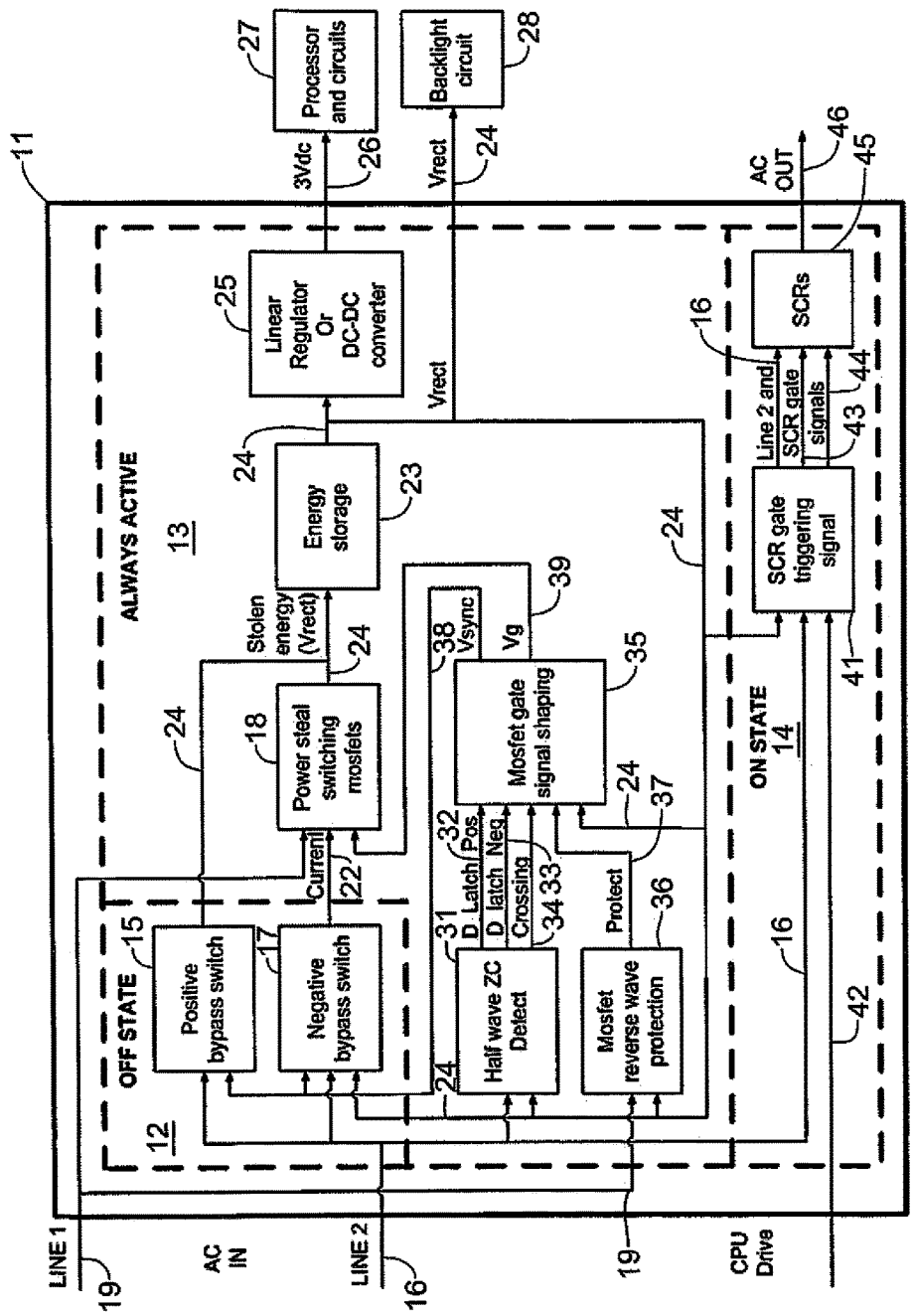
FIG. 1b is a diagram of a power supply unit having a layout divided into several areas incorporating an off state area, an always active area and an on state area.

FIG. 1b is a diagram of a power supply unit 11 having a layout divided into three areas incorporating an off state area 12, an always active area 13 and an on state area 14.

A positive bypass switch 15 in area 12 may have an input from a line 16 (2). Also in area 15 is a negative bypass switch 17. Line 16 may go to negative bypass switch 17. An AGND line 21 may be an input to switch 17.

Power steal switching MOSFETs 18 in area 13 may have an input from a line 19 (1) and be connected to an AGND (ground) line 21. A line 22 may go from negative bypass switch to power steal switching MOSFETs 18.

An energy storage 23 in area 13 may receive an input of Vrect (stolen energy) on line 24 from positive bypass switch 15 and an RS1G input on line 24 from power steal switching MOSFETs 18. An output Vrect on line 24 may go from energy storage 23 to a DC-DC (direct current) converter or linear regulator 25 of area 13. An output Vcc (3 Vdc) on a line 26 may go outside of unit 11 to a processor and circuits 27. Vrect on line 24 may go to a backlight circuit 28 outside of unit 11. Vrect on line 24 may also go to negative bypass switch 17.

A half wave ZC (zero crossing) detect 31 in area 13 may have an input connected to line 16 and an input connected to Vrect on line 24. Detect 31 may output a D latch positive signal on a line 32, a D latch negative signal on a line 33, and a crossing signal on a line 34. The signals on lines 32, 33 and 34 may go to a MOSFET gate signal shaping circuit 35 in area 13.

A MOSFET reverse wave protection circuit 36 in area 13 may have an input of Vrect on line 24 and of line 19 (1) of AC in. A protect signal on a line 37 may go from protection circuit 36 to shaping circuit 35. A Vsync signal on a line 38 may go from shaping circuit 35 to positive bypass switch 15 and to negative bypass switch 17. A Vg signal may be on a line 39 and may go to power steal switching MOSFETs 18.

An SCR gate triggering signal circuit 41 of area 14 may have inputs of Vrect on line 24, line 16 (2) of AC in and a CPU (computer) drive signal on a line 42. Circuit 41 may provide a gate signal Vgm+ on a line 43 and a gate signal Vgm− on a line 44 to an SCR circuit 45 of area 14. Line 16 (2) of AC in may be an input to SCR circuit 45. An AC out on a line 46 may be provided by circuit 45.

Figure 2A:
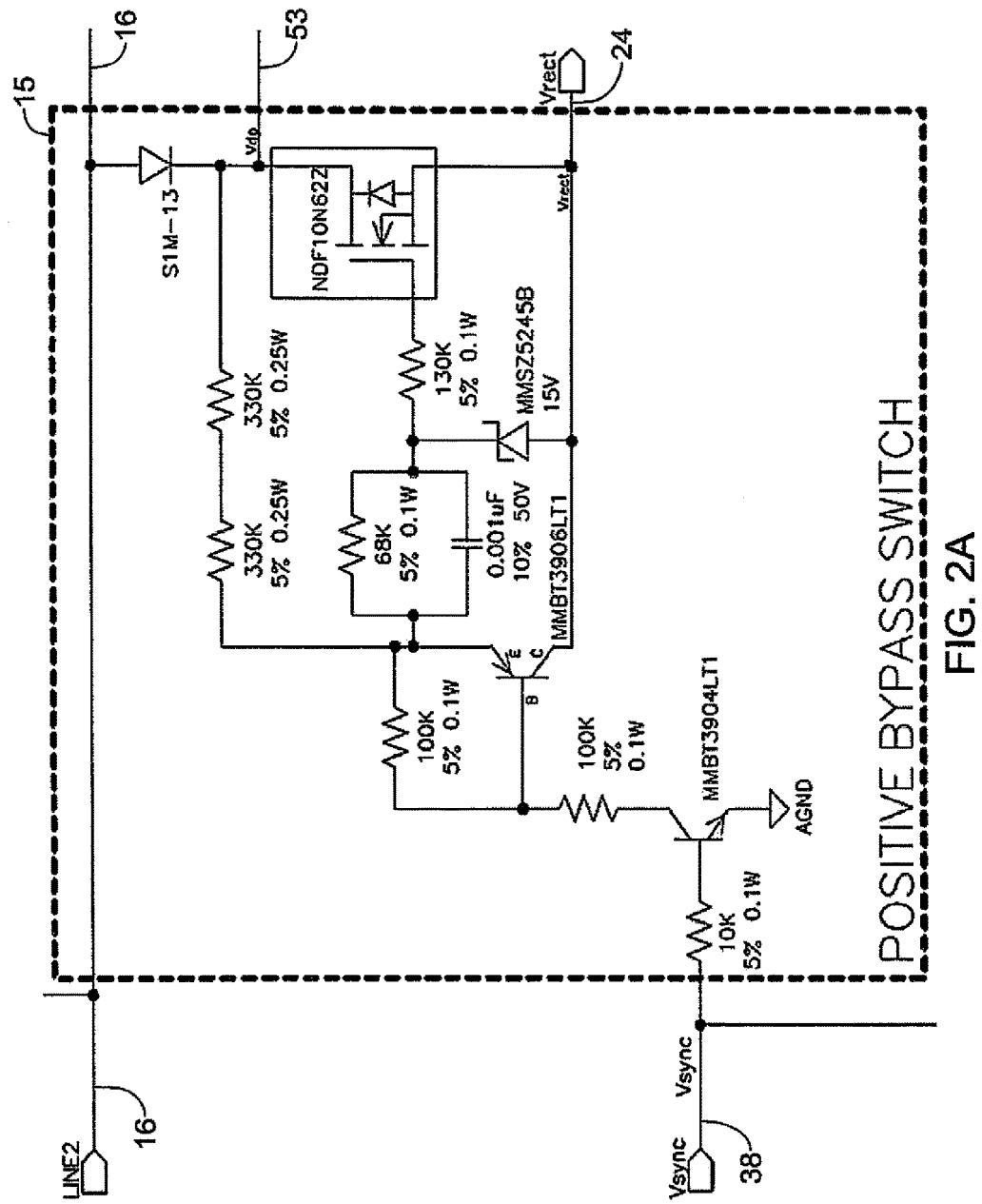
FIG. 2a is a diagram of a positive bypass switch.
Figure 2B:
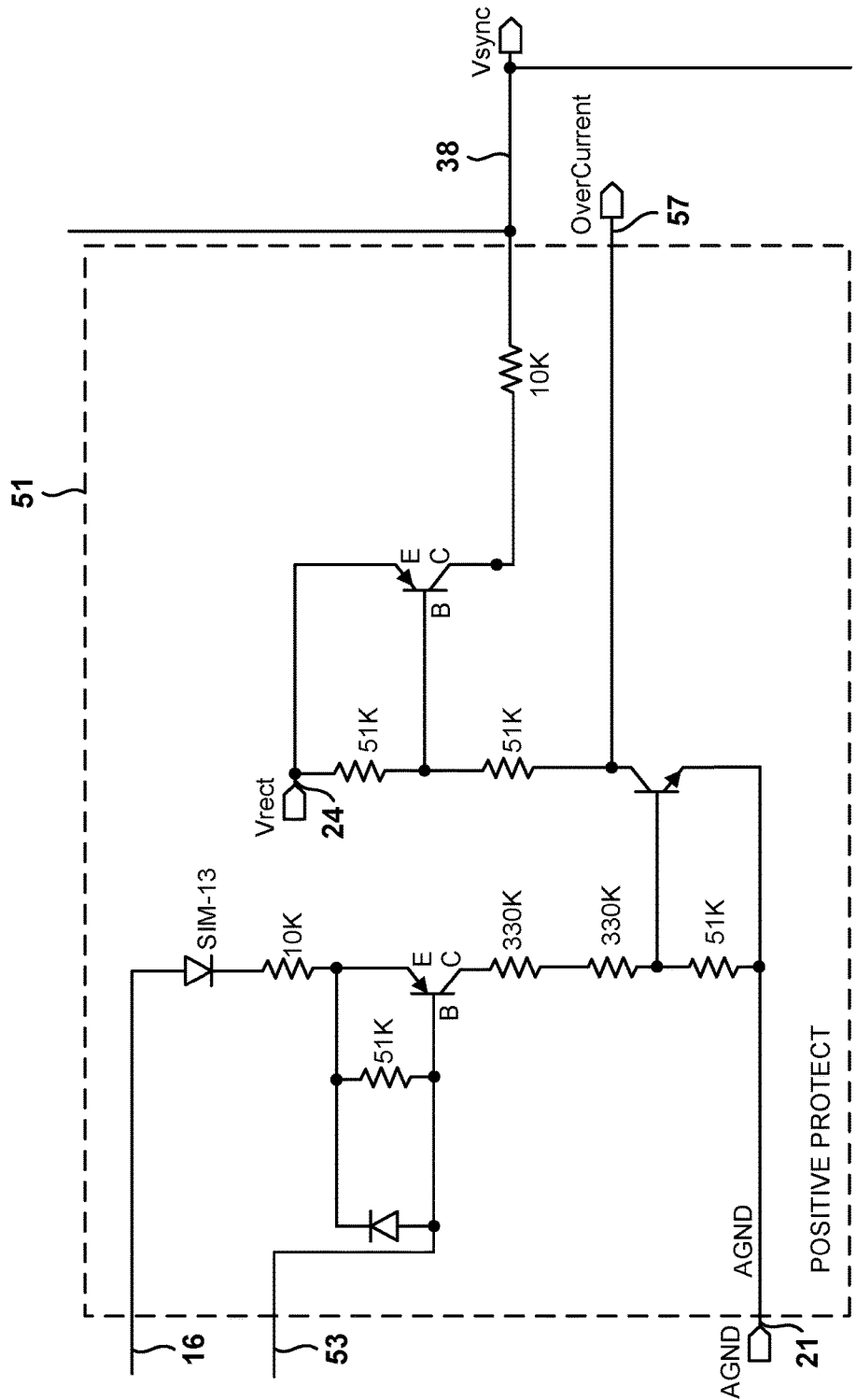
FIG. 2b is a diagram of a positive protect circuit connected to the positive bypass switch.

FIG. 2a is a diagram of positive bypass switch 15. Switch 15 may be connected to a positive protect circuit 51 as shown in a diagram of FIG. 2b. A Vdp signal may go on a line 53 from switch 15 to circuit 51.

Figure 3A:
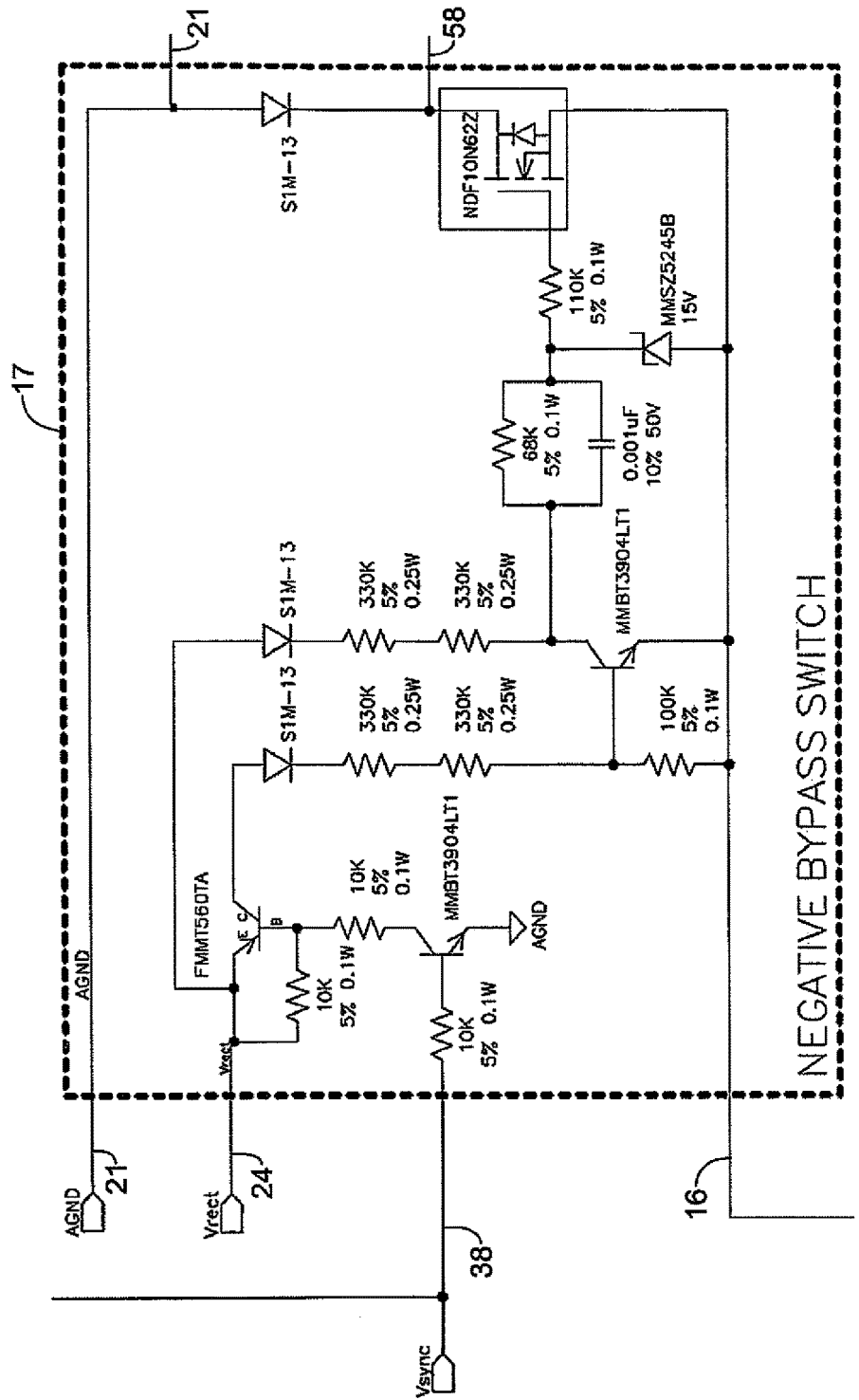
FIG. 3a is a diagram of a negative bypass switch.
Figure 3B:
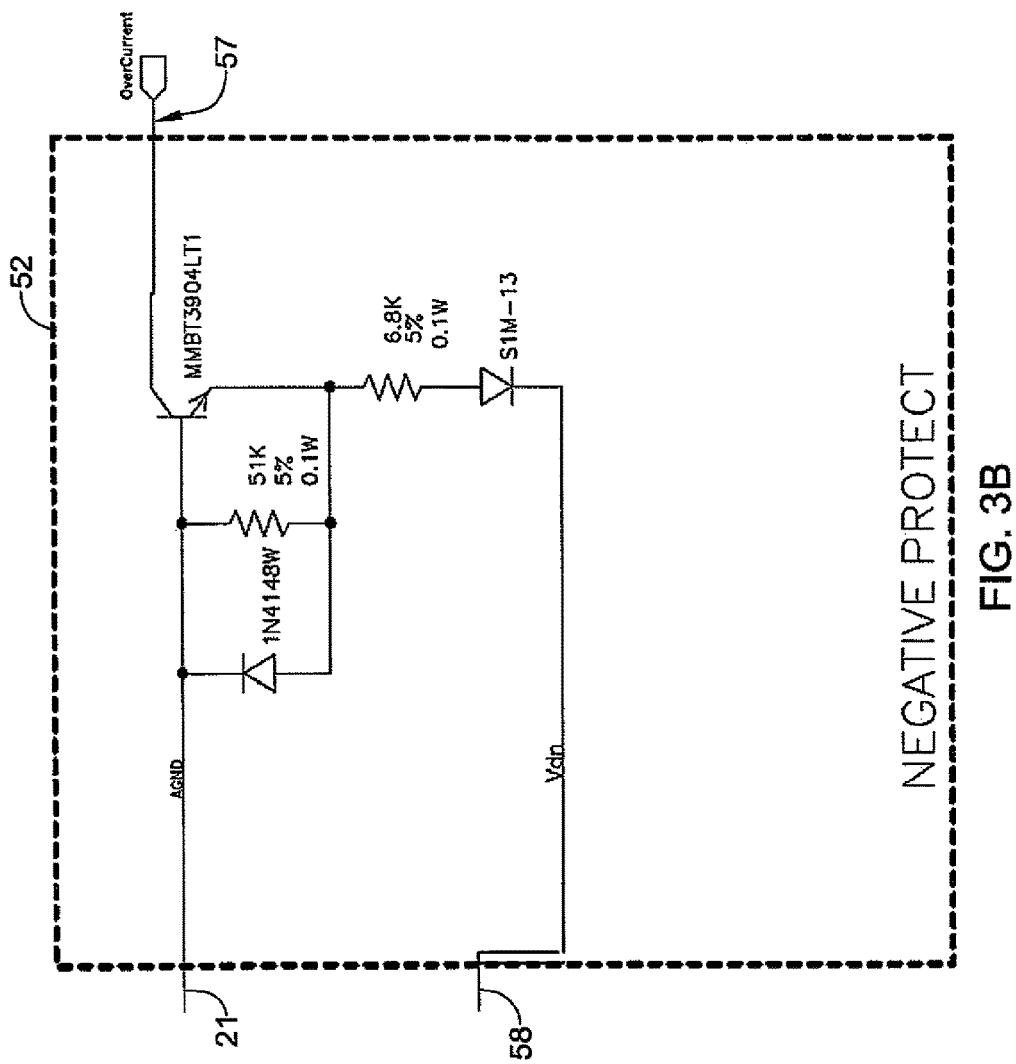
FIG. 3b is a diagram of a negative protect circuit connected to the negative bypass switch.

FIG. 3a is a diagram of negative bypass switch 17. Switch 17 may be connected to a negative protect circuit 52 as shown in a diagram of FIG. 3b. A Vdn signal may go on a line 58 from switch 17 to circuit 52. An over current terminal in circuit 51 may be connected via a line 57 with an over current terminal in circuit 52.

Figure 4:
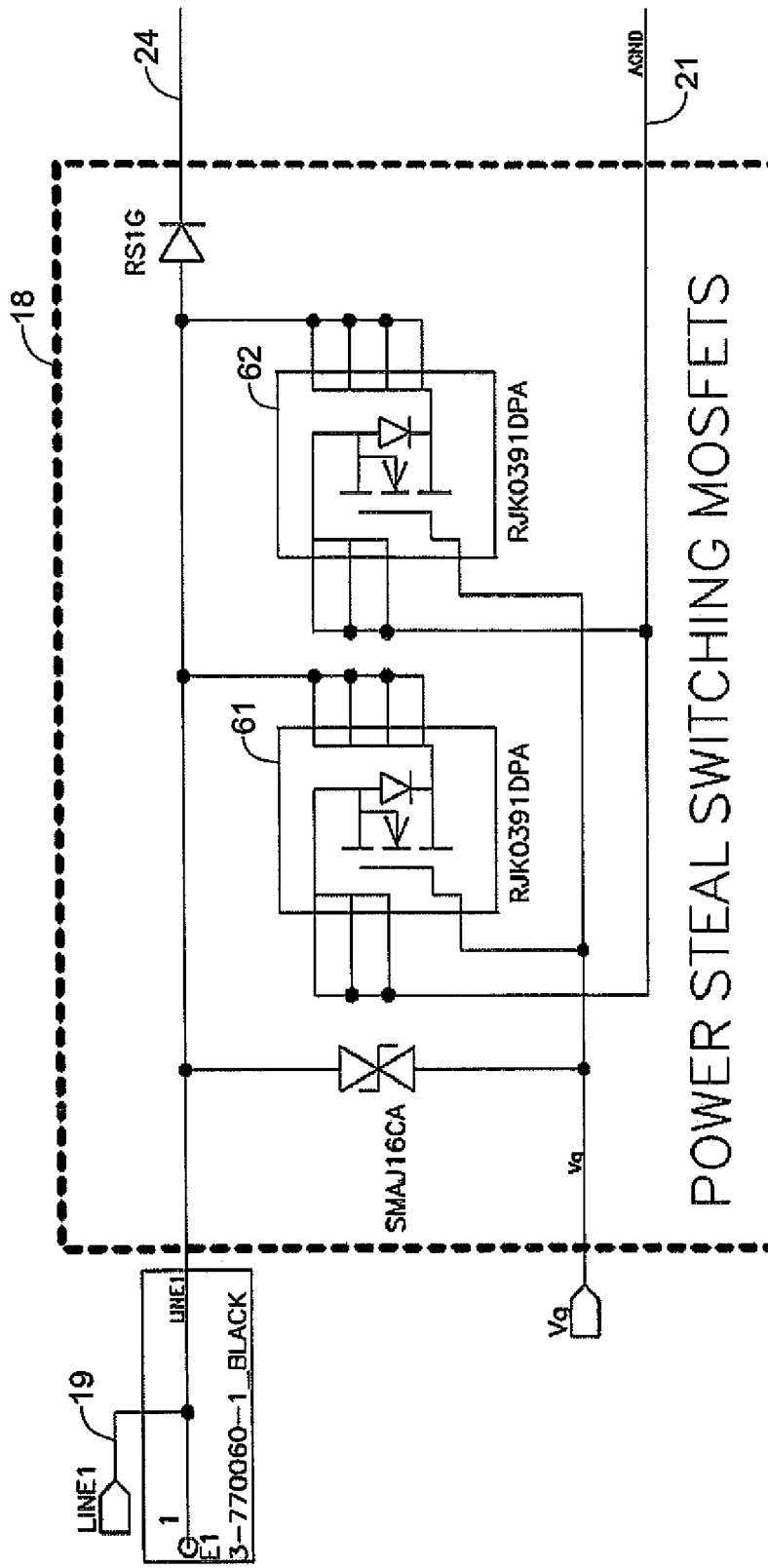
FIG. 4 is a diagram of a circuit showing power steal switching MOSFETs.
Figure 5:
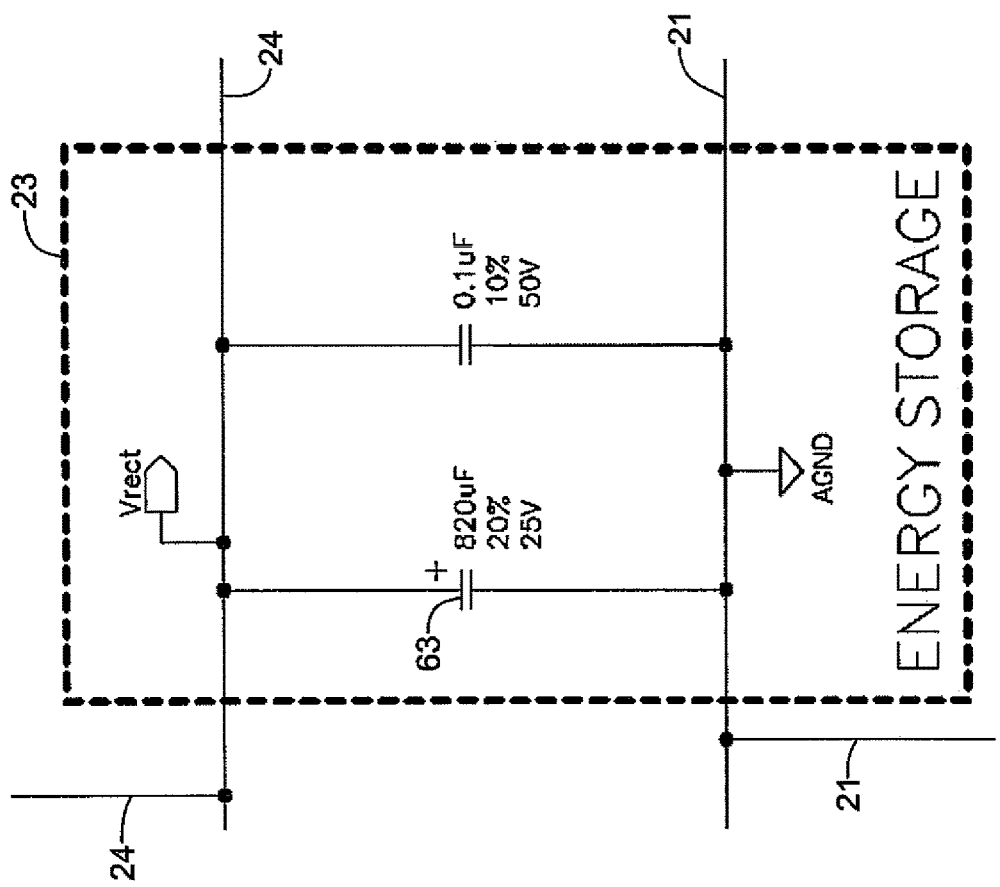
FIG. 5 is a diagram of a circuit showing a large capacity capacitor.
Figure 6:
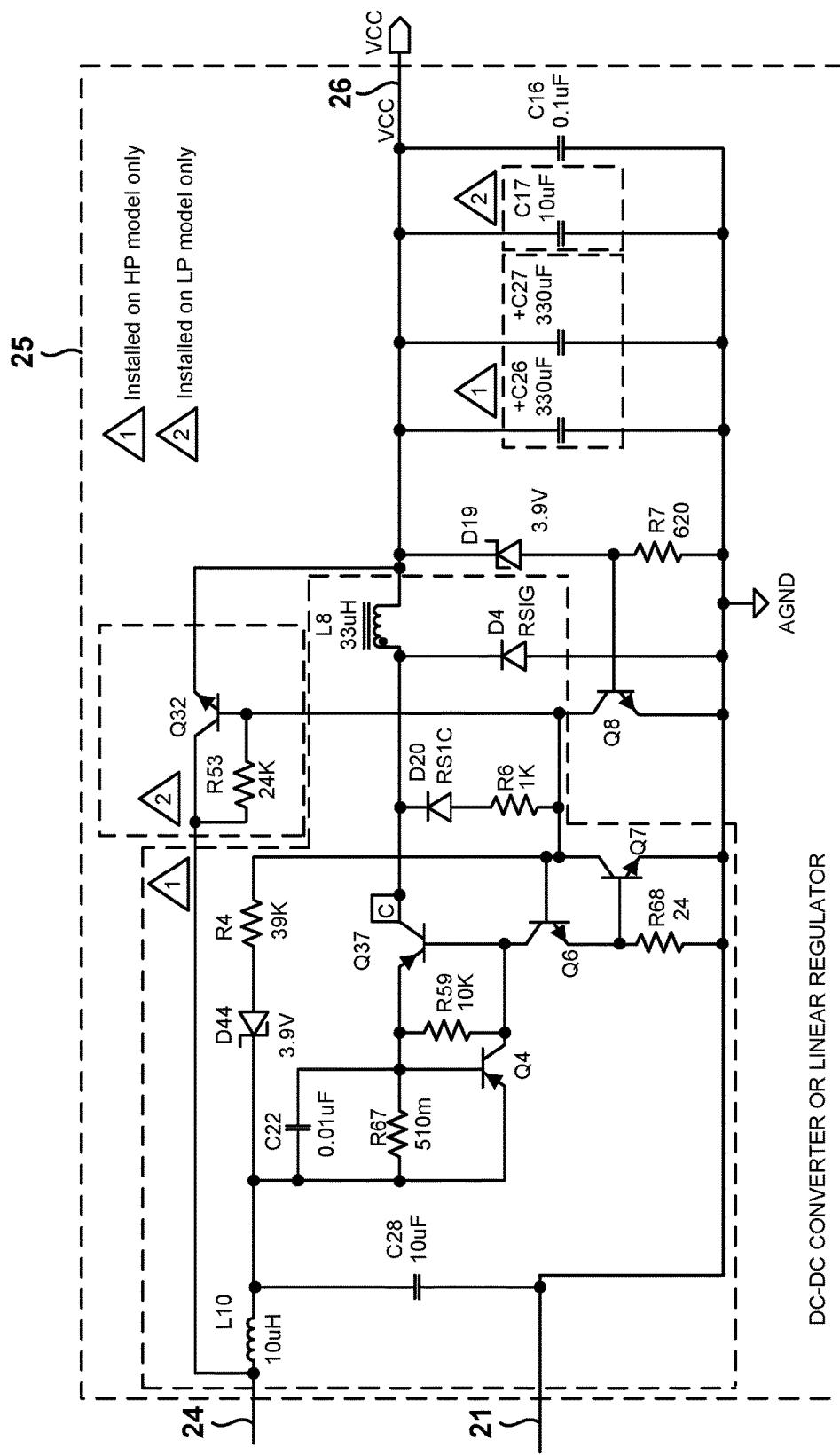
FIG. 6 is a diagram of a DC-DC converter or linear regulator circuit.

FIG. 4 is a diagram of circuit 18 showing power steal switching MOSFETs 61 and 62. FIG. 5 is a diagram of circuit 23 showing a large capacity (e.g., 820 microfarads) capacitor 63. FIG. 6 is a diagram of a DC-DC converter or linear regulator circuit 25.

Figure 7:
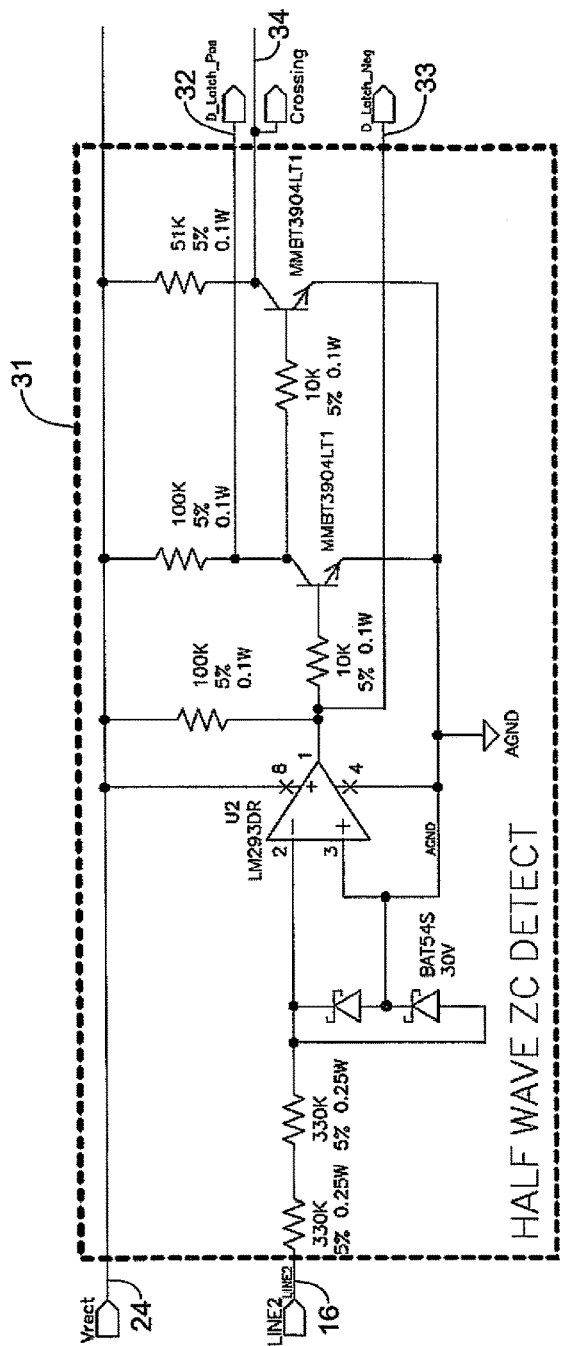
FIG. 7 is a diagram of a half wave zero crossing detect circuit.
Figure 8B:
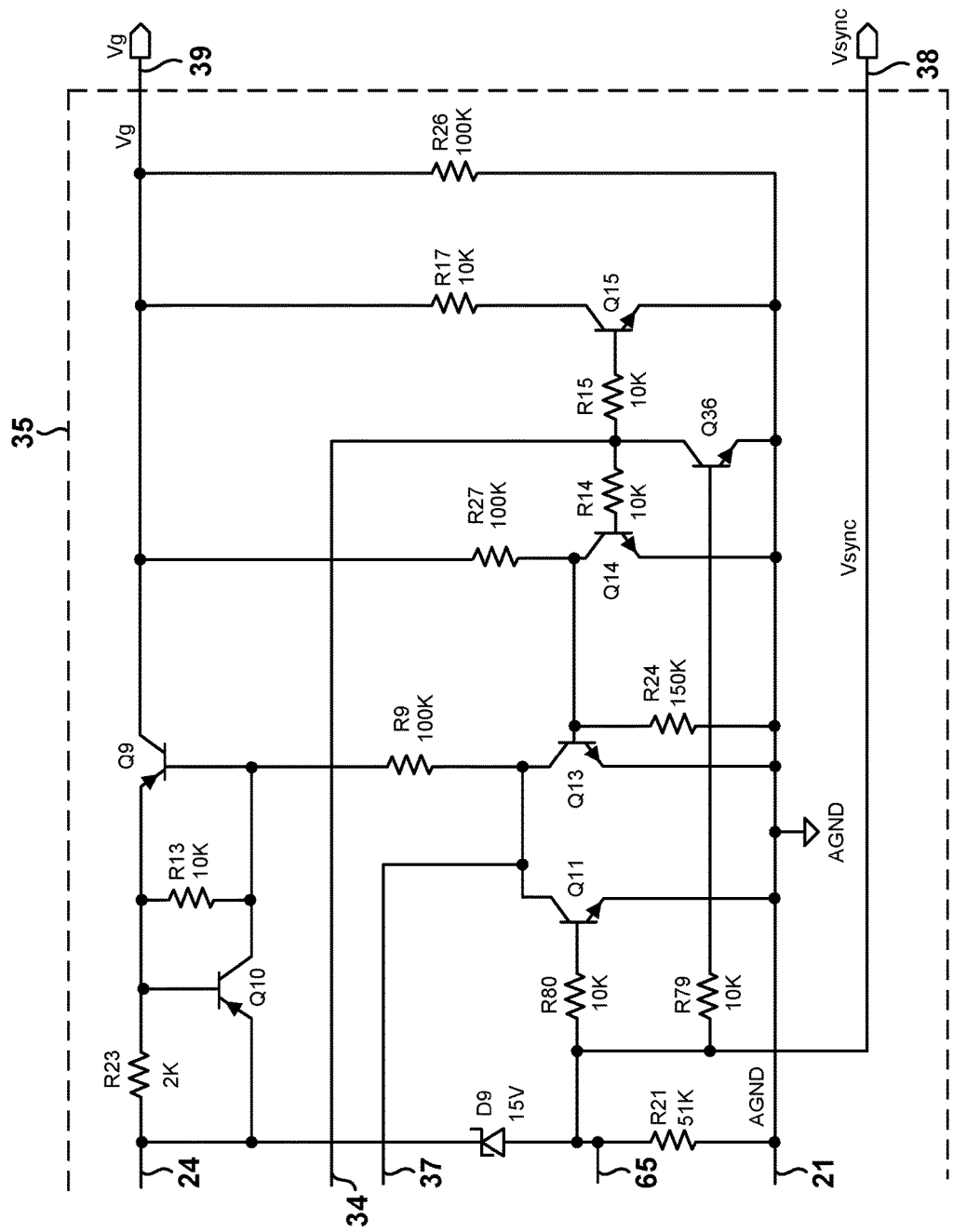
Figure 9:
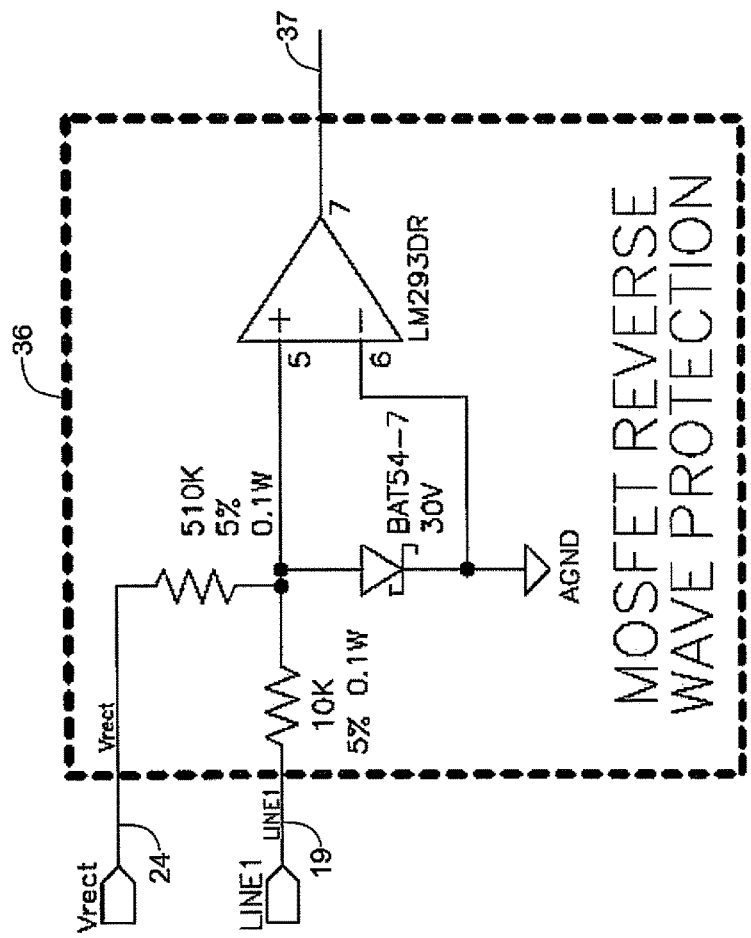
FIG. 9 is a diagram of a MOSFET reverse wave protection circuit.

FIG. 7 is a diagram of a half wave zero crossing detect circuit 31. FIG. 8a and FIG. 8b are diagrams of MOSFET gate signal shaping circuit 35. Lines 21, 24, 34, 37 and 65 connect the diagrams of FIGS. 8a and 8b to show the whole circuit 35. FIG. 9 is a diagram of MOSFET reverse wave protection circuit 36.

Figure 10:
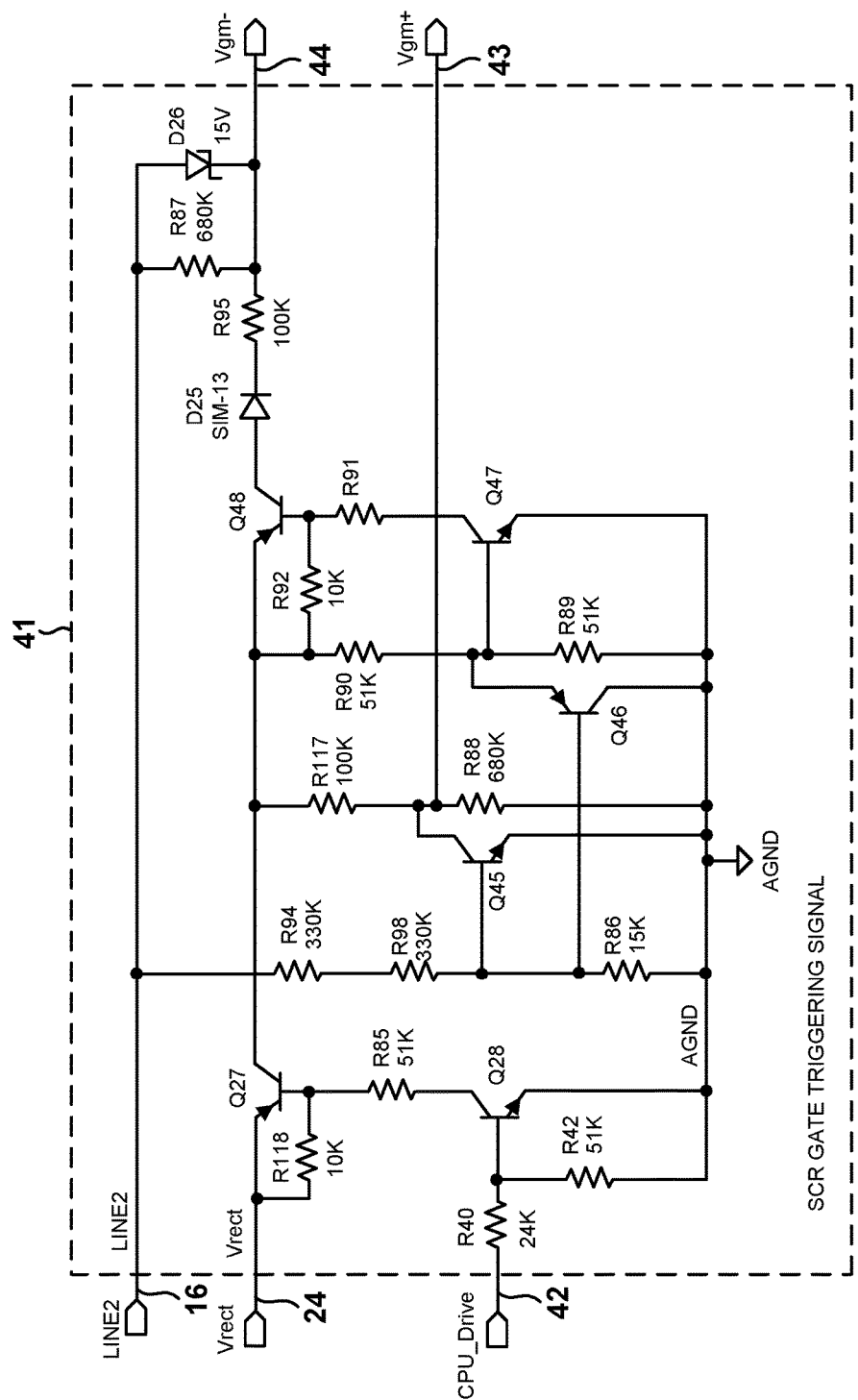
FIG. 10 is a diagram of an SCR gate triggering signal circuit.
Figure 11:
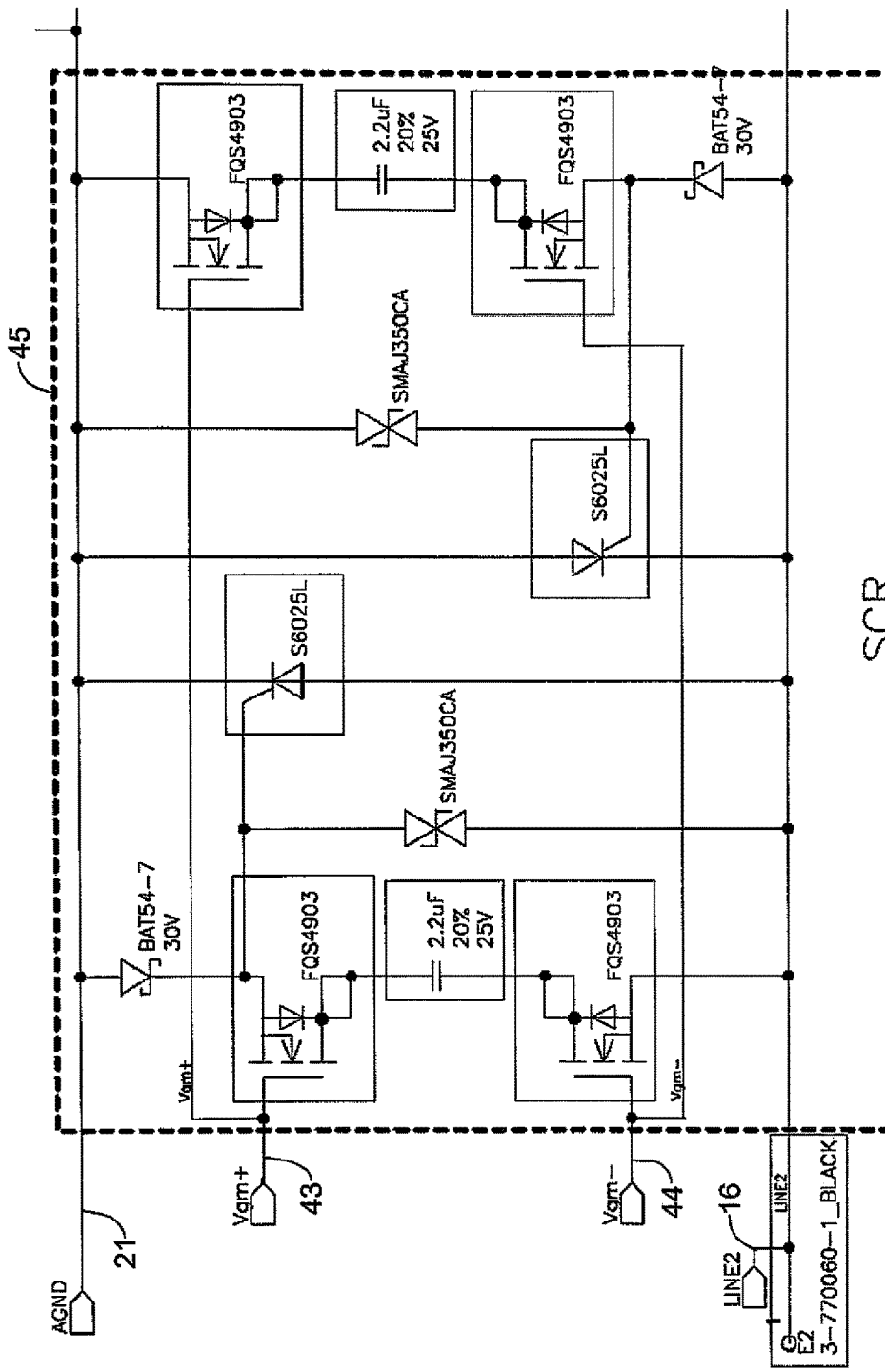
FIG. 11 is a diagram of an SCR circuit.

FIG. 10 is a diagram of SCR gate triggering signal circuit 41, which provides trigger signals Vgm+ and Vgm− on lines 43 and 44 to SCR circuit 45 shown in a diagram of FIG. 11.

Figure 12:
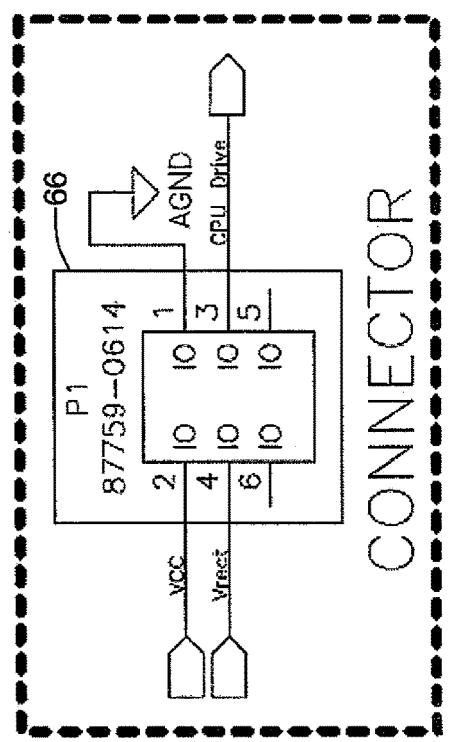
FIG. 12 is a diagram of a plug that may be used for various connections external to the power supply unit.

FIG. 12 is a diagram of a plug 66 that may be used for various connections external to unit 11.

To recap, an in-line thermostat power system may incorporate a bypass switch, a power stealing circuit connected to the bypass switch, an energy storage circuit connected to the power stealing circuit, an SCR interface circuit connected to the energy storage circuit, and an SCR circuit connected to the SCR interface circuit. The bypass switch may be a controllable switch for line voltage.

The line voltage controllable switch may incorporate a positive bypass switch and a negative bypass switch. The positive bypass switch may incorporate one or more line voltage MOSFETs. The negative bypass switch may incorporate one or more line voltage MOSFETs.

The positive bypass switch may incorporate a positive protect circuit. The negative bypass switch may incorporate a negative protect circuit.

The system may further incorporate a half wave zero crossing detection circuit connected to the energy storage circuit, and a gate signal shaping circuit connected to the half wave zero crossing detection circuit, the bypass switch, and the power stealing circuit. The power stealing circuit may incorporate one or more switching MOSFETs. The gate signal shaping circuit may provide a gate signal that results in a soft transition of turning on and off of the one or more MOSFETs of the power stealing circuit.

The SCR interface circuit may have a first input connected to an output of the energy storage circuit, a second input connectable to a line voltage, a third input connectable to a control signal source, and an output of gate signals. The SCR circuit may have a first input for gate signals from the SCR interface circuit, a second input connectable to a line voltage, and an output of a controlled line voltage.

The system may further incorporate a thermostat having a temperature sensor, a temperature setting adjuster, and a processor connected to the temperature sensor and a temperature setting adjuster. The processor may incorporate the control signal source that provides a signal to the SCR interface circuit which in turn outputs the gate signals to the SCR circuit, with a goal to bring a temperature indication from the temperature sensor and a temperature setting of the temperature setting adjuster to a same value.

The system may further incorporate a heater having terminals connected to a line voltage and an output of the SCR circuit. The temperature sensor may be situated in a space that contains the heater. The gate signals to the SCR may result in the output of the SCR circuit to control heat from the heater to achieve the goal to bring the temperature indication from the temperature sensor and the temperature setting of the temperature setting adjuster to a same value.

A thermostatic power supply mechanism may incorporate a first terminal for connection of a power source; a bypass switch having an input connected to the first terminal; an SCR circuit having a first connection connected to the first terminal, an input for a control signal, and a second connection connectable to a load; a second terminal for connection to a load; a stealing circuit having an input connected to an output of the bypass switch, and an output connected to the second terminal; and a power steal module having an input connected to the output of the SCR circuit and an output connected to the second terminal.

The bypass switch may incorporate one or more MOSFETs that are switched. The power steal module may incorporate one or more MOSFETs that are switched to steal power. The stealing circuit may have an energy storage unit. Stolen power may go to the energy storage.

The energy storage cell may incorporate one or more super capacitors.

The bypass switch may have circuitry that incorporates a positive bypass switching MOSFET, and a negative bypass switching MOSFET.

The mechanism may further incorporate a MOSFET gate signal shaper that provides a gate signal to the power steal module that softens a transition of turning on or off of the one or more MOSFETs.

The mechanism may further incorporate an SCR control signal circuit having an output that provides the control signal to the input of the SCR circuit. The control signal provided to the input of the SCR circuit may result in making power available or not available at the second connection of the SCR circuit. The second connection of the SCR circuit may be connected to the load. The load may be a heater.

A power supply unit for a thermostat and electric heater may incorporate a bypass switch circuit having an input connectable to a first line voltage, a power steal device having an input connectable to an output of the bypass switch circuit, an energy storage having an input connected to an output of the power steal device, an SCR gate signal circuit having an input connected to an output of the energy storage, and an SCR circuit having an input from an output of the SCR gate signal circuit and an input connectable to a second line voltage, and having an output for providing a controlled second line voltage. The bypass switch circuit may have one or more MOSFET switches. Also, the power steal device may have one or more MOSFET switches.

The unit may further incorporate a linear regulator connected to the output of the energy storage.

The unit may further incorporate a zero crossing detector having an input connectable to the second line voltage.

The unit may further incorporate a FET gate signal shaping circuit having an input for receiving zero crossing information from the zero crossing detector and having an output for providing a sync signal to the bypass switch circuit.

The unit may further incorporate a reverse wave protection circuit having an input connected to the first line voltage, a second input connected to the output of the energy storage, and having an output for providing a protect signal to the FET gate signal shaping circuit.

U.S. patent application Ser. No. 13/868,754, filed Apr. 23, 2013, and entitled "Triac or Bypass Circuit and MOSFET Power Steal Combination", is hereby incorporated by reference.

In the present specification, some of the matter may be of a hypothetical or prophetic nature although stated in another manner or tense.

Although the present system and/or approach has been described with respect to at least one illustrative example, many variations and modifications will become apparent to those skilled in the art upon reading the specification. It is therefore the intention that the appended claims be interpreted as broadly as possible in view of the related art to include all such variations and modifications

What is claimed is:

1. An in-line thermostat power system comprising:
a controllable bypass switch comprising a first line voltage metal-oxide-semiconductor field-effect transistor (MOSFET) and a second line voltage MOSFET, the controllable bypass switch receiving line voltage as an input;
a power stealing circuit receiving an output of the bypass switch as an input;
an energy storage circuit receiving an output of the power stealing circuit as an input;
a silicon controlled rectifier (SCR) interface circuit receiving an output of the energy storage circuit as an input; and
an SCR circuit receiving an output of the SCR interface circuit as an input.

2. The system of claim 1, wherein:
the controllable bypass switch comprises a positive bypass switch and a negative bypass switch;
the positive bypass switch comprises the first line voltage MOSFET; and
the negative bypass switch comprises the second line voltage MOSFET.

3. The system of claim 2, wherein:
the positive bypass switch comprises a positive protect circuit; and
the negative bypass switch comprises a negative protect circuit.

4. The system of claim 2, further comprising:
a half wave zero crossing detection circuit connected to the energy storage circuit; and
a gate signal shaping circuit connected to the half wave zero crossing detection circuit, the bypass switch, and the power stealing circuit; and
wherein:
the power stealing circuit comprises a switching MOSFET; and
the gate signal shaping circuit provides a gate signal that results in a soft transition of turning on and off of the switching MOSFET of the power stealing circuit.

5. The system of claim 1, wherein:
the SCR interface circuit has a first input connected to an output of the energy storage circuit, a second input connectable to a line voltage, a third input connectable to a control signal source, and an output of gate signals; and
the SCR circuit has a first input for gate signals from the SCR interface circuit, a second input connectable to a line voltage, and an output of a controlled line voltage.

6. The system of claim 5, further comprising:
a thermostat comprising:
a temperature sensor;
a temperature setting adjuster; and
a processor connected to the temperature sensor and the temperature setting adjuster; and
wherein the processor comprises the control signal source that provides a signal to the SCR interface circuit which in turn outputs the gate signals to the SCR circuit to bring a temperature indication from the temperature sensor and a temperature setting of the temperature setting adjuster to a same value.

7. The system of claim 5, further comprising:
a heater comprising terminals connected to a second line voltage and an output of the SCR circuit; and
wherein:
the temperature sensor is situated in a space that contains the heater; and
the gate signals to the SCR result in the output of the SCR circuit to control heat from the heater to bring the temperature indication from the temperature sensor and the temperature setting of the temperature setting adjuster to a same value.

8. A thermostatic power supply mechanism comprising:
a first terminal for connection of a power source;
a second terminal for a connection to a load; a bypass switch comprising an input directly connected to the first terminal, the bypass switch comprising one or more metal-oxide-semiconductor field-effect transistors (MOSFETs) that are switched;
a silicon controlled rectifier (SCR) circuit comprising a first input connected to the first terminal, a second input for connection to a control signal, and an output terminal for a controlled line voltage for a load;
a stealing circuit comprising an input connected to an output of the bypass switch, and an output connected to the second terminal, wherein the stealing circuit comprises an energy storage unit to store stolen power.

9. The mechanism of claim 8, further comprising:
a power steal module comprising an input connected to the output terminal of the SCR circuit and an output connected to the second terminal; and
wherein:
the power steal module comprises one or more MOSFETs that are switched to steal power.

10. The mechanism of claim 8, wherein the energy storage unit comprises one or more super capacitors.

11. The mechanism of claim 8, wherein the bypass switch has circuitry that comprises:
a positive bypass switching MOSFET; and
a negative bypass switching MOSFET.

12. The mechanism of claim 9, further comprising a MOSFET gate signal shaper that provides a gate signal to the power steal module that softens a transition of turning on or off of the one or more MOSFETs.

13. The mechanism of claim 8, further comprising:
an SCR control signal circuit comprising an output that provides the control signal to the second input of the SCR circuit; and
wherein the control signal provided to the second input of the SCR circuit is configured to control whether power is available or not available at the output terminal of the SCR circuit.

14. The mechanism of claim 13, wherein:
the output terminal of the SCR circuit is connected to the load; and
the load is a heater.

15. A power supply unit for a thermostat and electric heater comprising:
a bypass switch circuit comprising an input directly connectable to a first line voltage, the bypass switch circuit comprises one or more metal-oxide-semiconductor field-effect transistor (MOSFET) switches;
a power steal device comprising an input connectable to an output of the bypass switch circuit;
an energy storage unit comprising an input connected to an output of the power steal device; and
a silicon controlled rectifier (SCR) circuit comprising an input connectable to the first line voltage, and comprising an output for providing a controlled second line voltage.

16. The unit of claim 15, further comprising an SCR gate signal circuit comprising a first input connected to an output of the energy storage unit, a second input for connection to a control signal source, and an output connected to the SCR circuit.

17. The unit of claim 16, further comprising a linear regulator connected to the output of the energy storage unit.

18. The unit of claim 15, further comprising a zero crossing detector comprising an input connectable to the first line voltage.

19. The unit of claim 18, further comprising a FET gate signal shaping circuit comprising an input for receiving zero crossing information from the zero crossing detector and comprising an output for providing a sync signal to the bypass switch circuit.

20. The unit of claim 19, further comprising a reverse wave protection circuit comprising an input connected to a second line voltage, a second input connected to the energy storage unit, and comprising an output for providing a protect signal to the FET gate signal shaping circuit.

21. The unit of claim 15, wherein the power steal device comprises one or more MOSFET switches.

* * * * *